United States Patent [19]

Weijland et al.

[11] 4,272,776

[45] Jun. 9, 1981

[54] SEMICONDUCTOR DEVICE AND METHOD OF MANUFACTURING SAME

[75] Inventors: Bernard H. Weijland, Nijmegen; Wilhelmus H. C. G. Verkuijlen, Eindhoven, both of Netherlands

[73] Assignee: U.S. Philips Corporation, New York, N.Y.

[21] Appl. No.: 254,604

[22] Filed: May 18, 1972

[30] Foreign Application Priority Data

May 22, 1971 [NL] Netherlands .................. 7107039

[51] Int. Cl.³ .................................... H01L 27/04
[52] U.S. Cl. ...................................... 357/50; 357/52; 357/54; 357/59; 357/44; 357/51
[58] Field of Search ........ 317/235 AT, 235 E, 235 F; 357/47, 48, 49, 50, 59, 52, 54

[56] References Cited

U.S. PATENT DOCUMENTS

| | | | |
|---|---|---|---|
| 3,372,063 | 3/1968 | Suzuki et al. | 317/235 F |
| 3,386,865 | 6/1968 | Doo | 317/235 F |
| 3,432,792 | 3/1969 | Hatcher | 317/235 AT |
| 3,500,139 | 3/1970 | Frouin et al. | 317/235 F |
| 3,534,234 | 10/1970 | Clevenger | 317/235 F |
| 3,598,664 | 8/1971 | Kilby | 317/235 F |
| 3,607,466 | 9/1971 | Miyazaki | 317/235 AT |
| 3,617,822 | 11/1971 | Kobayashi | 317/235 AT |
| 3,621,346 | 11/1971 | Chang et al. | 317/235 AT |
| 3,648,125 | 3/1972 | Peltzer | 317/235 |
| 3,649,386 | 3/1972 | Murphy | 317/235 |
| 3,657,612 | 4/1972 | Wedmann | 317/235 Z |
| 3,659,162 | 4/1972 | Wada et al. | 317/235 |
| 3,702,790 | 11/1972 | Nakanuma et al. | 317/235 AT |
| 3,703,420 | 11/1972 | Vora | 317/235 AT |
| 3,718,843 | 2/1973 | Kooi | 317/235 |
| 3,736,193 | 5/1973 | Tucker et al. | 317/235 AT |
| 3,796,613 | 3/1974 | Magdo et al. | 357/50 |
| 3,865,624 | 2/1975 | Wilde | 357/59 |

OTHER PUBLICATIONS

Electronics Review, Jun. 1, 1964, p. 23.
Magdo et al., IBM Tech. Discl. Bull., vol. 13, No. 11, Apr. 1971, p. 3238.
Pieczonka et al., IBM Tech. Discl. Bull., vol. 8, No. 4, Sep. 1965, p. 670.

Primary Examiner—William D. Larkins
Attorney, Agent, or Firm—Thomas A. Briody; Robert T. Mayer; Steven R. Biren

[57] ABSTRACT

An inset oxide isolated integrated circuit, with multiple levels of inset oxide, polycrystalline regions, and channel stops.

32 Claims, 21 Drawing Figures

SEMICONDUCTOR DEVICE AND METHOD OF MANUFACTURING SAME

The invention relates to a semiconductor device, in particular a monolithic integrated circuit, comprising a monocrystalline semiconductor substrate body having at least one semiconductor layer provided thereon on one side, at least one isolation zone being locally provided in said layer. According to a known embodiment, such a semiconductor layer is provided epitaxially on a monocrystalline semiconductor substrate body, in which said epitaxial layer may have a conductivity type opposite to that of the substrate body. By means of isolation zones, the epitaxial layer may be divided into juxtaposed mutually isolated islands. According to a known method, said isolation zones consist of a semiconductor material of a conductivity type opposite to that of the epitaxially provided semiconductor material. Such isolation zones can be formed in a conventional manner by locally indiffusing a suitable impurity from the surface of the epitaxial layer. At the same time, an impurity of the same type, which was locally diffused previously in the substrate surface, may diffuse into the epitaxial layer from the substrate. One or more zones may be provided in such an island, for example by diffusion, to form a semiconductor circuit element, for example a transistor a diode, a resistor or a capacitor. The material itself of the epitaxial layer remaining after said formation may form a component of the circuit element but in principle it may also serve for isolation of a circuit element incorporated in the island. As against the advantage that such isolation zones can be formed according to conventional planar methods and that they can be covered in a usual manner with an oxide layer across which metal conductors can be conducted, for example for interconnections of circuit elements in various islands, there is the drawback that such an isolation zone has a high doping concentration in particular at the surface as a result of which the p-n junction formed with an adjacent island zone has a comparatively low breakdown voltage and a high capacity. Zones of a conductivity type opposite to that of the epitaxially provided material provided in the island should also be separated from the isolation zone by an intermediate zone of the type of the epitaxially provided material, for example, of the epitaxial material itself. Such a separation requires more space at the surface. When said intermediate zone has a low doping concentration, for example, as is often used for doping in the original epitaxially provided material, there exists the possibility that inversion channels are formed at the surface which produce a short-circuiting connection between the isolation zone and a zone present in the island. In order to prevent such an inversion, the surface concentration of the doping may be increased by diffusion but in this case either sharper p-n junctions are formed with accordingly lower breakdown voltage and higher capacity, or more space is required so as to obtain some distance between said highly doped region and the isolation zone.

In such semiconductor devices consisting of silicon it has already been proposed to manufacture such isolation zones from silicon oxide. This oxide which should be inset in the silicon to a comparatively large depth is obtained by local oxidation of the silicon during which adjacent silicon is protected in a suitable manner, for example, by using a silicon nitride layer.

In this latter method, silicon dioxide is formed which occupies a larger volume than the original silicon which was converted. As a result of this an uneven surface may be formed since the silicon dioxide projects above the adjacent silicon. Said oxide parts projecting above the silicon may be etched away, if desired, by means of a controlled etching method. It has been proposed, however, to locally etch the silicon prior to the local oxidation so that grooves are formed. When the deep oxidation process is carried out at the area of said grooves, said grooves can just be filled as a result of the increase in volume associated with the conversion of silicon into silicon oxide. Not only can an approximately plane surface be obtained but the resulting oxide is also inset over a larger depth.

Although the use of isolation zones consisting of insulation material which is formed by conversion of semiconductor material has particular advantages with respect to isolation zones which consist of diffusion zones of the opposite conductivity type, for example, avoiding the above-described drawbacks of the known semiconductor isolation zones, a lower capacitive coupling and the possibility of larger space saving, since in this case lateral p-n junctions may be extended to the isolation zones, it has been found that side effects or phenomena may occur which are associated with the formation of the isolation zone, which side phenomena can adversely influence the electric properties of the semiconductor device. In the semiconductor material which is partly converted, impurities may be present, for example, serving as a doping for the material present beside the isolation zone, or in addition impurities which cannot be controlled or are hard to eliminate. In general, the solubility for such an impurity in the converted material will be different from that in the semiconductor material itself. Furthermore, during the conversion, temperatures may be used at which diffusion of such impurities can occur. It may occur that certain impurities present during the conversion are expelled fully or partly and migrate to the adjacent non-converted semiconductor material. Due to an ever increasing accumulation during the progress of the boundary between the formed insulation material and the semiconductor material, such an increased concentration of such impurities may occur in the semiconductor material near that boundary as a result of which, for example, the conductivity type may invert. The danger exists that as a result of this a short circuiting connection is obtained between two regions on either side of the isolation zone. It is alternatively possible that a certain impurity present in the semiconductor material has a preference for the converted material. When a temperature is used, either during the formation of the isolation zone or afterwards, at which said impurity can diffuse, such an impurity will want to diffuse to said isolation zone from the adjacent semiconductor material, By extraction of such an impurity, for example, if it determined the conductivity type of the adjacent semiconductor material, the conductivity type can again invert, for example, in that remaining impurities of the opposite conductivity type predominate. When two impurities are present which behave differently in this respect and in addition have opposite conductivity types, an accumulating effect may occur. Furthermore, near the boundary of the isolation zone the extrinsic conductivity may be so reduced that, for example as a result of charge centres in the form of ions in the insulation material, inversion can again occur.

One of the objects of the present invention is to reduce or eliminate the disturbing effect of the above-mentioned phenomena.

According to the invention, a semiconductor device, in particular a monolithic integrated circuit, comprising a monocrystalline semiconductor substrate body having at least one semiconductor layer provided thereon and in which at least one isolation zone is locally provided which consists at least partly of a layer of insulating material inset from the surface of the semiconductor layer, is characterized in that said inset insulation layer adjoins at least locally a buried insulation layer of an insulating material present locally at the substrate surface.

Such a construction is of particular advantage if the inset insulation layer consists of an insulating material which is formed by conversion of the semiconductor material of the provided semiconductor layer or layers.

As regards depths of inset, depths of more than $0.5\mu$, preferably at least $1\mu$, are preferably used. Since the inset insulation layer on its lower side adjoins a buried insulation layer, if any, of one conductivity type, formed along the edge of the insulation layer by accumulation and/or extraction of impurities, is divided into two zones present on either side of the inset insulation layer and separated from each other by insulating material.

It is to be noted that it is possible in principle that accumulated impurities could be absorbed by the buried layer. In itself this need not be a drawback. Upon prolonged after-heating, for example in further steps in the manufacture of the semiconductor device after providing the inset insulation layer, however, such an impurity absorbed by the buried layer might diffuse into the underlying semiconductor material. It is therefore desirable to use for the buried layer a material which has only little tendency for absorbing said impurity. For that purpose is to be considered in particular a buried insulation layer which consists, at least partly, of the same raw material as the inset insulation layer. If the inset insulation layer has an extracting effect on a certain impurity present, for example, silicon oxide on boron present as a doping in silicon, the inset insulation layer can in principle be doped sufficiently with said impurity for compensation purposes. If the inset insulation layer has been obtained by conversion of the semiconductor material, the semiconductor material to be converted may previously be doped to a sufficient extent with said impurity at that area. However, it depends upon the configuration of the semiconductor device to be manufactured whether such a way of doping is permissible.

It is possible, in particular during further temperature treatments, that the extracting effect expands to the material below the buried insulation layer by extraction via said buried insulation layer. This may be the case in particular if the buried insulation layer consists of the same raw material as the inset insulation layer. According to a preferred embodiment, a buried insulation layer may be used in such a case which contains said extractable impurity.

In the previously proposed method, in which an inset insulation layer of an insulating material formed by conversion of the semiconductor material was used as isolation zones, a disadvantage was that the thickness of the insulation layer was restricted in that the conversion reaction for manufacturing the isolation zone was increasingly slowed as the insulation layer grew thicker and hence the distance from the adjacent semiconductor material to the surface of the insulation layer from which the reagents for the conversion of the semiconductor material are available, became larger. As a result of this limits were also imposed upon the thickness of the zones to be provided for the semiconductor circuit element or the semiconductor circuit elements to be provided. In operating such circuit elements, comparatively low breakdown voltages of p-n junctions and punch-through effects had to be taken into account. The present invention affords the possibility of using isolation zones which consist of insulating material of a larger thickness. For example, the buried insulation layer may be inset in the substrate and may also consist of insulating material formed by conversion of the semiconductor substrate material. Also in the case in which one may be sure that no annoying diffusion phenomena or accumulation phenomena will occur during the formation of the inset layer of insulating material, the last-mentioned measure thus has an important advantage over the previously proposed method of the single inset layer of insulating material. When the substrate itself consists of a semiconductor body and a semiconductor layer deposited thereon, it is possible to cause the underlying inset insulation layer to again reach a buried insulation layer. This layer in turn may consist of an inset insulation layer or be provided on such a layer. It will be obvious that in this manner isolation zones can be used which contain a number of inset layers of insulating material present one above the other. As a result of this it becomes possible to use deeper-extending structures for semiconductor circuit elements and a larger number of zones of different conductivities or different conductivity types.

It is to be noted that in certain circumstances during the deposition of semiconductor material on the substrate in which said deposition on the monocrystalline semiconductor material of the substrate occurs epitaxially, said deposition on the buried insulation layer will in general be polycrystalline. In principle, this polycrystalline material may be converted entirely. In general one will do this when the presence of said polycrystalline material is unfavourable. In many cases, however, the local presence of polycrystalline material is permissible. In the configuration described, such a region of remaining polycrystalline semiconductor material is in general bounded by insulation material on its lower side and, laterally, at least on one side. It is also possible to make an advantageous use of differences in properties between polycrystalline and monocrystalline semiconductor material. It has been found, for example, that in many cases a certain impurity diffuses more rapidly in polycrystalline than in monocrystalline semiconductor material.

When the semiconductor layer which is provided on the monocrystalline semiconductor substrate body consists of silicon, the insulation layer inset in said layer preferably consists of silicon oxide. In that case the buried layer preferably consists also of silicon oxide. When the monocrystalline semiconductor material of the substrate body also consists of silicon, the buried silicon oxide layer may be obtained in known manner by thermal oxidation but it may also consist of silicon oxide deposited on the semiconductor body. The silicon oxide of the buried layer may be present in the silicon substrate and be inset. Another excellently suitable material for the buried layer is silicon nitride. Silicon nitride is resistant against oxidation and masks the substratum against indiffusion or extraction of impurities even better than silicon oxide. Moreover it does substantially not react with the silicon which is deposited on the buried layer. In principle, however, a variety of materials are possible for the buried insulating layer, for example, mixed oxides which may be present in one or more phases, for example consisting of silicon oxide and other oxides. Aluminium oxide is another possibility.

Furthermore it is possible in principle to provide on or in the buried insulation layer a conductive material which can withstand the high temperatures used for providing the semiconductor layer and providing the inset insulation layer. In principle might be considered such materials as tungsten, molybdenum, tantalum or platinum. In this manner conductive tracks can be enclosed which are bounded by insulation material both on the upper and lower sides and laterally.

According to a further preferred embodiment, inset or buried conductors or resistors of the semiconductor material itself may be used which bear on their lower side on buried insulation material and are bounded on either side by inset insulation material which adjoins the buried insulation material. The semiconductor material of such conductors will in general be polycrystalline. They can be made sufficiently conductive by doping. By also providing insulating material on the upper sides of such an inset or even buried conductor of semiconductor material, crossing conductors may be used in principle which, with the exception of the connection places, are separated by insulating material both from each other and from the remainder of the semiconductor material. By using substantially no or a low doping concentration in inset buried tracks of polycrystalline semiconductor material, resistors may also be obtained.

It is furthermore to be noted that in addition to inset layers of insulating material adjoining buried layers of insulating material, locally inset layer of insulating material may also be used which do not adjoin buried insulating material. This is of advantage in particular when a conductive connection should be produced between regions on either side of the inset insulation layer underneath said insulation layer. If desirable, doping as a result of the accumulation effect for said conductive connection may advantageously be used at that area, while at other locations this is counteracted due to the presence of a buried insulation layer. In this manner, a collector contacting zone may be conductively connected to a deep collector region on the other side of an inset layer of insulating material in which case a flat base-collector junction may be used which adjoins inset insulating material laterally or throughout its circumference.

When a number of insulation layers one above the other are used, for example, in an isolation zone between two islands of an integrated circuit, such an insulation layer, which, for example, may be in the form of a strip, be inset or even buried, may be locally interrupted so as to produce in this manner a conductive connection of a semiconductor material between two regions on either side of the insulation zone. Since a buried insulation layer is present below said conductive connection, the material of said conductive connection will in general be polycrystalline. For a good conductive connection the material of such a conducting connection will in generally be highly doped and preferably have the same conductivity type as the regions which it connects together.

The invention also relates to a method of manufacturing a semiconductor device according to the invention. This method is characterized in that the semiconductor substrate body is locally provided with an insulation layer of insulating material present at its surface, after which at least one semiconductor layer is provided on the substrate surface, both on and beside the said insulation layer, so that the insulation layer is buried in the semiconductor, and zones of the provided layer or layers of semiconductor material which are provided on the buried insulation layer are then converted into insulating material while using a masking pattern protecting against the conversion, said conversion being carried through to such a depth that the formed insulation layer in the provided layer or layers of semiconductor material are inset down to the buried insulation layer. According to a preferred embodiment, the layer or the set of layers of semiconductor material, prior to the conversion of the zones, is locally removed over part of its thickness in such manner that thereby an accidental surface is formed which after the local conversion is smoothed at least partly by the variation in volume associated with the conversion. A layer of silicon is preferably provided and, in order to form the insulation zones therein, said silicon is locally oxidized. According to a preferred embodiment, the buried insulation layer is formed by the local conversion of the semiconductor material of the substrate. By using a masking pattern masking against the conversion, said buried insulation layer may be inset in the substrate body. In this case also, for example, when the conversion involves an increase in volume, so much semiconductor material of the substrate may be locally removed by a local etching treatment that after the conversion process the level of the buried oxide layer corresponds approximately to the level of the semiconductor material of the substrate body present at the surface. In this manner an isolation zone can be obtained which consists of converted semiconductor material which may have approximately double the thickness of a single inset layer of insulating material. According to a preferred embodiment, the substrate body may be formed previously by depositing a semiconductor layer on a semiconductor body. Prior to the provision of the last-mentioned semiconductor layer, the semiconductor body is preferably provided with a layer of insulating material present locally at the surface of said body and, after providing the semiconductor layer to form the substrate, the buried insulation layer is preferably provided so as to at least locally adjoin the insulating material present at the surface of the body.

It is to be noted that the invention is not restricted to integrated circuits. Inset insulation layers on buried insulation layers may also be used advantageously in discrete semiconductor devices. In particular in semiconductor devices which are destined for use at high frequencies, the lateral boundary of insulating material may advantageously be used, for example, to decrease stray capacitances and to obtain junctions, for example, p-n junctions, which are substantially flat throughout their surface.

In order that the invention may be readily carried into effect, it will now be described in greater detail, by way of example, with reference to the accompanying drawings which are diagrammatic cross-sectional views of parts of possible embodiments of semiconductor devices according to the invention or stages in the manufacture thereof.

FIG. 8 shows the semiconductor device thus manufactured.

FIG. 19 shows the semiconductor device thus manufactured.

The manufacture of an embodiment of a semiconductor device according to the invention will now be described with reference to FIGS. 1 to 8 which are cross-sectional views of a detail of such a device in various stages of its manufacture. Starting material is a semiconductor body consisting of monocrystalline p-type silicon having a resistivity of 1 ohm cm (see FIG. 1). Such a disc-shaped silicon body 1 can be obtained in normal manner by dividing a rod-shaped monocrystal in known manner into slices and reducing said slices, if desired, to the desired thickness, for example 150μ, by known material-removing treatments. On one side the surface of the silicon body is provided with an insulation layer 2 the lower part of which may consist of boron-doped silicon oxide and the upper part of which may consist of undoped silicon oxide, which layer may have an overall thickness of 0.5μ and be provided by deposition at low temperature, for example, by reaction of SiH$_4$ with oxygen. The boron may be added in the form of boron hydride.

Figure 1:
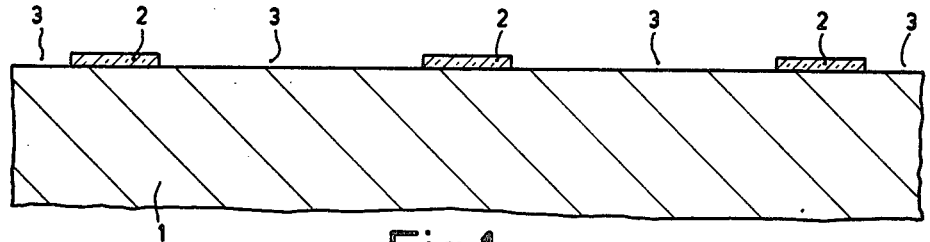
FIGS. 1-8 are successive stages in the manufacture of a semiconductor device comprising at least one diode and n-p-n transistors.
Figure 2:
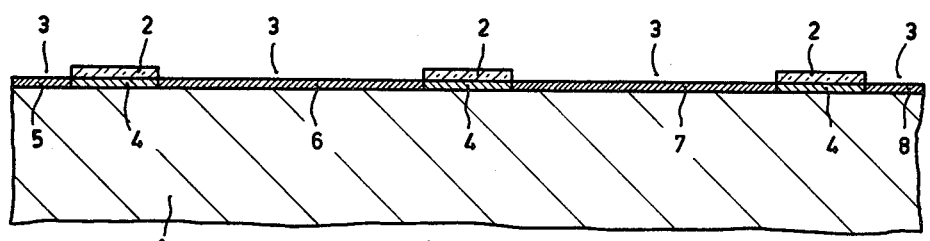
Figure 3:
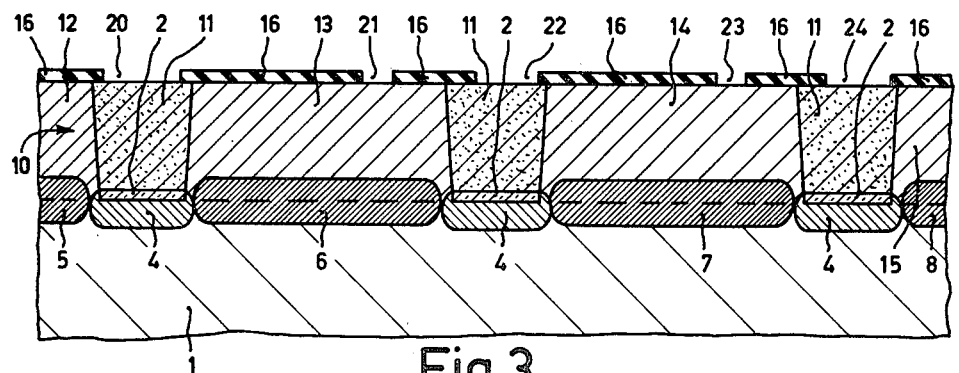

Windows 3 are etched in the insulation layer 2 by means of a conventional photoetching method. The remaining insulation layer thereby obtains the form of a network the windows 3 of which form the meshes. The resulting stage is shown diagrammatically in FIG. 1. The silicon body is then subjected to a conventional diffusion treatment with arsenic, the insulation layer 2 serving as a mask. The resulting stage is shown diagrammatically in FIG. 2. A comparatively shallow arsenic diffusion has taken place in the windows, the n-conductive layers 5, 6, 7 and 8 being formed. Simultaneously with the arsenic diffusion, boron is diffused into the underlying silicon from the insulation layer 2 so that at that area a highly doped p-conductive zone 4 is formed which adjoins the p-conductive material of the body and which forms a lateral separation of the n-conductive regions 5, 6, 7 and 8. The semiconductor body thus treated now serves as a substrate for providing a semiconductor layer of silicon. The silicon may be deposited, for example, from a gas mixture, of SiH$_4$ and hydrogen to which a little PH$_3$ has been added. The thickness of the provided layer 10 is approximately 2.5μ (see FIG. 3). From the semiconductor surface in the windows 3 the silicon grows epitaxially and forms monocrystalline n-conductive regions 12, 13, 14 and 15. Silicon likewise deposits on the insulation layer 2 but in a polycrystalline form. As a result of this the layer 10 consists of a network of polycrystalline material 11 which laterally separates the monocrystalline regions 12, 13, 14 and 15 from each other. The layer 2 now forms a buried insulation layer in the resulting semiconductor body. The layer 10 is provided at its surface with a silicon nitride layer 16, thickness for example 0.15μ, obtained by deposition from a silicon hydride and ammonia-containing gas mixture. If desirable a thin oxide layer may be provided previously below the silicon nitride. Windows are etched in the silicon nitride layer by means of known photo etching methods, of which the windows 20, 22 and 24 are provided above the polycrystalline material 11. Together they again constitute a network. Windows 21 and 23, respectively, are furthermore provided locally on the monocrystalline regions 13 and 14, each window having the form of a strip which adjoins on either side the network of windows which is provided on the polycrystalline material 11. The resulting stage is shown in FIG. 3.

Figure 4:
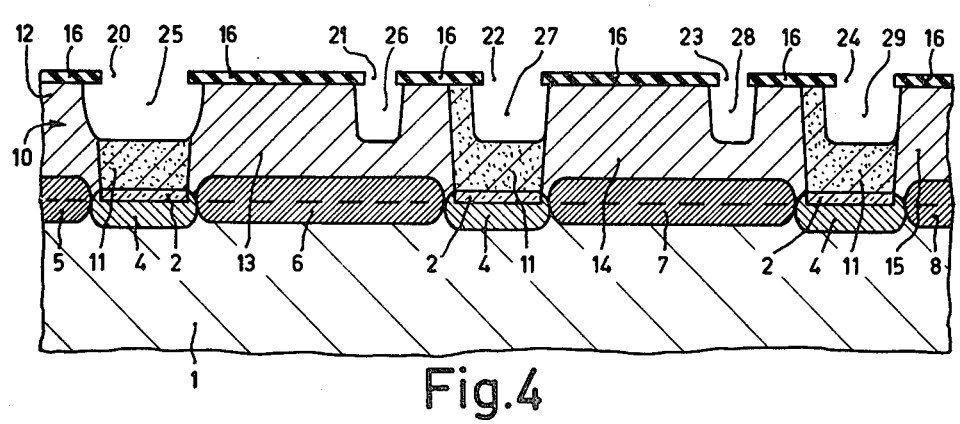

The silicon is then subjected to an etching treatment, the silicon nitride layer 16 serving as a mask. The grooves 25, 26, 27, 28 and 29, respectively, are etched at the area of the windows 20, 21, 22, 23 and 24, respectively. The etching process is continued until a depth of 1μ has been obtained in the deposited silicon layer 10. The resulting stage is shown in FIG. 4.

Inset insulation layers are then made by using a deep oxidation at the area of the grooves, the silicon nitride layer 16 being now used as a local masking of the underlying silicon against the oxidizing treatment. Since the silicon is converted into oxide, an increase in volume takes place so that when as a result of the oxidation process the depth increases, the groove itself will gradually be filled by formed silicon oxide. As a result of this the oxide layers 30, 31, 32, 33 and 34, respectively, having depths of well over 2μ (see FIG. 5) are formed at the area of the grooves 25, 26, 27, 28 and 29, respectively. Such a deep oxidation is obtained, for example, by heating the silicon body for 32 hours at 900° C. in steam of atmospheric pressure. The oxide layers 30, 32 and 34 adjoin the buried oxide layer 2 with their lower sides. The inset oxide layers 31 and 33 extend down to the buried n-type silicon layers 6 and 7, respectively, which in the meantime may have expanded in the silicon layer 10 from the substrate by further diffusion of arsenic. Beside the inset oxide layers 32 and 34, parts 42 and 44 of the polycrystalline silicon zone 11 have been maintained. The low-ohmic n-type epitaxial regions 13 and 14 have been divided into the regions 36, 37 and 38, 39, respectively, by the formation of the inset insulation layers 31 and 33, respectively. The resulting stage is shown in FIG. 5.

Figure 5:
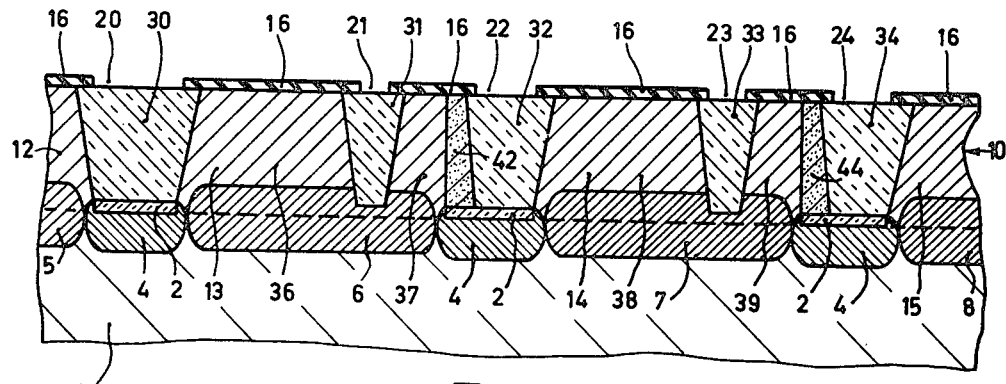

During the operations carried out to obtain the stage shown in FIG. 5, the following side phenomena may occur. During provision of the semiconductor layer 10, the polycrystalline silicon 11 may be doped with boron from the buried insulation layer 2 (compare FIG. 3). As is known, impurities can generally diffuse into polycrystalline silicon much more rapidly than in monocrystalline silicon. The boron might possibly be diffused to a considerable height, perhaps even up to the upper side of the layer 11. As a result of this the layer 11 can contain both the donor arsenic and the acceptor boron. In the formation of the inset oxide layers 30, 32 and 34 by conversion of the polycrystalline silicon, the following phenomena may occur. The oxide which is being formed has the tendency of rejecting the donor to the adjacent silicon and extracting the boron from the adjacent silicon. As a result of this, for example, the boron concentration in the remaining polycrystalline parts 42 and 44 can decrease again while the donor concentration therein will be increased again. The inset oxide layers 31 and 33 which are formed in n-conductive silicon may cause, during their formation, a slightly increased donor concentration at the edge. The comparatively high-ohmic silicon which is reformed does not contain so much donor material, however, that said increased donor concentration will be considerable. Only when the oxide formation penetrates to such a depth that material of the more highly doped buried n-type layers 6 and 7 is converted, can a donor concentration increase in the adjoining semiconductor material be caused at the lower side due to the described accumulation effect. As a result of this an n-conductive connection remains below the layers 31 and 33 between the regions 36, 37 and 38, 39, respectively, via the buried layers 6 and 7, respectively. This may advantageously be used in the further construction of the semiconductor device to be manufactured.

Since the inset oxide layers 30, 32 and 34 adjoin the buried insulation layer 2, a shortcircuiting n-conductive connection between the n-conductive regions on either side of the latter inset insulation layers by means of an n-conductive zone formed against the lower side of the said inset insulation layers cannot occur. When using a buried insulation layer of pure silicon oxide, a shortcircuiting connection might occur between the buried n-type layers 5, 6, 7 or 8 possibly by extraction of boron from the substrate material, in particular in the period during which the forming inset oxide layers 30, 32 or 34 are already in contact with the buried layer 2 or by inversion by oxide charge present in the buried layer 2. The presence of boron in the buried layer 2 now prevents such a channel formation in that a highly doped p-type zone 4 is formed below the buried oxide. In addition, the boron-extracting effect of the forming inset oxide layers 30, 32 and 34 will have no noticeable effect in the semiconductor material of the substrate since the buried oxide layer 2 is present as a source for said extraction.

The resulting structure shown in FIG. 5 consists of a p-type semiconductor substrate 1 having provided thereon islands of n-type material which are separated from each other by a network of insulation zones which from the surface to the substrate material 1 consist of an inset insulation layer 30, 32, 34 obtained by conversion of the semiconductor material, in this case by oxidation of the silicon, and thereon a buried insulation layer 2 adjoining the lower side and in this case consisting of boron-containing silicon oxide, and the adjoining highly doped p-type zone 4.

It is to be noted that instead of boron-doped silicon oxide, also called borate glass, for the buried insulation layer, silicon nitride may also be used advantageously. This layer may also serve as a mask for the arsenic diffusion to form the buried n-type zones 5, 6, 7 and 8. Such a buried silicon nitride layer does not pass boron. The forming buried insulation zone 30, 32 and 34 can consequently not perform an extracting effect on the substrate material present below the silicon nitride. The highly dope p-type zone 4 may be omitted also since such a silicon nitride layer generally involves many surface conditions as a result of which the formation of conductive inversion channels is counteracted. As a result of the omission of the highly doped p-type zone 4, the p-n junctions between the p-type material below the buried insulation layer 2 and the adjacent buried n-type layers 5, 6, 7 and 8 become less steep so that a higher breakdown voltage is obtained.

It is furthermore to be noted that after providing the semiconductor layer 10 the location of the buried insulation layer 2 is very clearly visible so that a photomask used to form windows 20, 21, 22, 23 and 24 in the silicon nitride layer 16 can easily be aligned on the pattern of the buried insulation layer 2 (compare FIG. 3).

Figure 6:
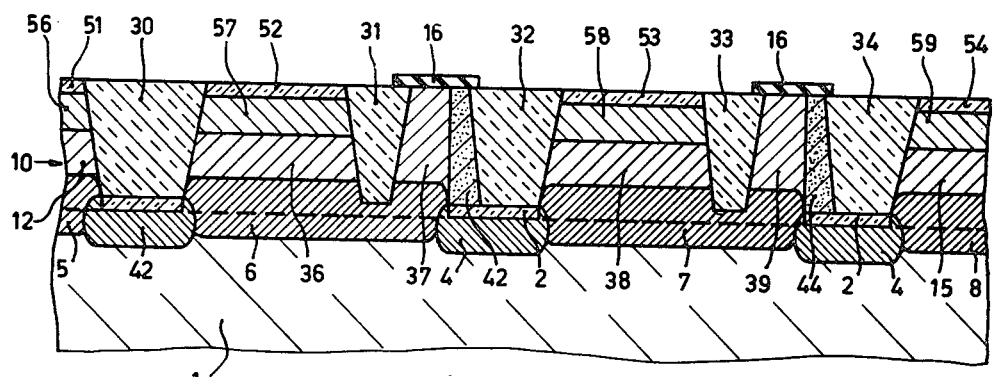

Semiconductor devices can now be formed in the resulting islands which are isolated from each other, for example, n-p-n transistors in the regions 13 and 15 and a diode in the region 14. For this purpose the silicon nitride layer 16 is removed by means of an etching method known per se from the regions 12, 36, 38 and 15 but is maintained on the regions 37 and 39 (see FIG. 6). Boron is in-diffused from the surface of said regions, p-conductive regions 56, 57, 58 and 59 being formed which are laterally bounded by insulation material and on their lower side adjoin with a substantially flat p-n junction the underlying n-type material as this was originally provided epitaxially during the formation of the layer 10. The zones 57 and 59 serve to form the base zones of the transistors. P-type zone 58 and n-type zone 38 form the electrodes of the diode. A possibly formed oxide skin on the p-type zones 56, 57, 58 and 59 is removed by etching and a fresh oxide skin 51, 52, 53 and 54 is provided at that area, for example, by means of a known oxidation reaction during which a thin oxide layer of, for example, $0.5\mu$ is formed. The remaining nitride layer 16 serves as a mask for protecting the regions 37, 42 and 39, 44. The resulting stage is shown in FIG. 6. It is to be noted that a silicon nitride mask, to be removed afterwards, for diffusion processes is preferably used if the temperatures used during the diffusion process are not too high, for example, remain below 1100° C., since silicon nitride which is heated at at least 1100° C. can be dissolved less easily. However, it is possible to remove the silicon nitride entirely for the diffusion treatment to form the zones 56, 57, 58 and 59 and to use locally a diffusion mask of, for example, silicon oxide.

Figure 7:
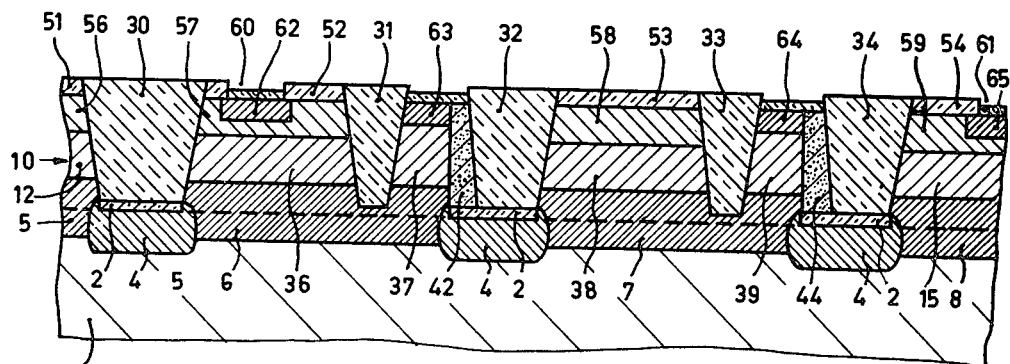

The mask of the parts 37, 42 and 39, 44 is removed in known manner and windows 60 and 61, respectively, are formed in known manner in the oxide layers 52 and 54. Phosphorus is then diffused to form the n-type emitters 62 and 65 in the base zones 57 and 59, respectively, and to form highly doped n-type regions 63 and 64 in the regions 37 and 39. The polycrystalline regions 42 and 44 are also doped heavily with phosphorus throughout their thickness as a result of the higher diffusion rate of phosphorus in polycrystalline material. During the diffusion treatment thin layers of phosphate glass may be formed on the unmasked parts. The resulting stage is shown in FIG. 7. The possibly formed thin phosphate glass on the silicon surface can be removed in known manner with a suitable etching liquid while maintaining oxide coatings 51, 52, 53 and 54. Windows for contacting the base regions 57 and 59 and the electrode 58 are then etched by means of known photographic methods. Metal contact layers are then provided in known manner, namely an emitter contact layer 66, a base contact layer 67, a collector contact layer 68 and an anode contact layer 69, and a cathode contact layer 70, a base contact layer 71 and an emitter contact layer 72. The resulting semiconductor device is shown in FIG. 8.

Figure 8:
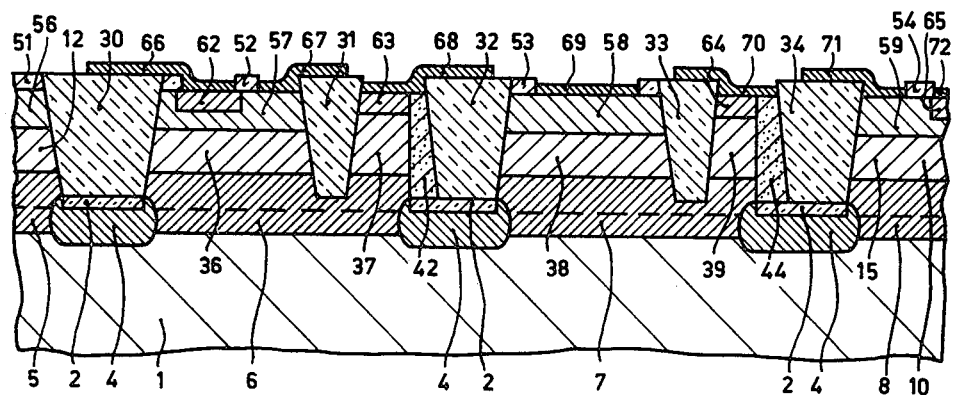

The semiconductor device shown in FIG. 8 now comprises an n-p-n transistor having a base zone 57 in which an emitter zone 62 is provided, the base zone adjoining a collector zone 36. This collector zone 36 which consists of comparatively high-ohmic epitaxial material adjoins a readily conducting buried n-type layer 6 which on the one hand reduces the lateral resistance in the collector and furthermore contacts underneath the inset oxide layer 31 the n-type region 37 in which the low-ohmic n-type connection zone 63 is provided on the upper side. In this manner the collector region 36 is electrically connected to the collector contact 68. The comparatively high-ohmic material of the region 37 which may give a collector-series resistance is present between the low-ohmic contact zone 63 and the buried layer 6. Since, however, a deep phosphorus diffusion has taken place in the polycrystalline region 42, as a result of which this whole region has become low-ohmic n-type, a connection of low resistance has formed between the contact 68 and the buried layer 6. The base-collector junction between the region 36 and the base zone 57 is substantially flat and has no sharp corners which would mean a decrease of the base-collector breakdown voltage. It is to be noted that only a part of the transistor consisting of emitter 65, base 59 and collector region 15 is shown in FIG. 8 but it will be obvious that this transistor may have an equal construction as the transistor described above having an emitter 62, a base 57 and collector region 36.

In a manner similar to the connection of the collector region 36 to the collector contact 68, the electric connection between the cathode 38 and the anode contact 70 is formed, namely via the buried layer 7, the polycrystalline phosphorus-doped n-type region 44 and the highly doped zone 64.

The inset oxide layers may advantageously be used as a substratum of conductive metal strips connected to the contacts. As a result of the thickness of said inset insulation layers the distance between said conductive strips of the conductor pattern and the underlying semiconductor zone is large and hence the mutual capacitive couplings are low. If, for example, the inset insulation layers form a network of strips of said layers, the metallic connection strips may advantageously be laid in the longitudinal direction on said strips.

Figure 9:
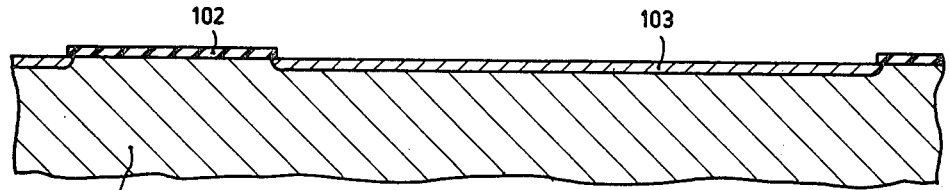
FIGS. 9-19 show successive stages in the manufacture of a semiconductor device comprising at least one transistor, at least one resistor of semiconductor material and good conductive connection strips of a semiconductor material present below the level of the semiconductor surface.

The manufacture of another embodiment of the semiconductor device according to the invention will now be described with reference to the FIGS. 9 to 19. Starting material is a p-type monocrystalline plate-shaped semiconductor body 101 on which a silicon nitride mask 102 is provided on one side (FIG. 9). The silicon nitride masking layer 102 may have the form of a network with windows in which the semiconductor surface is exposed. By induffusing arsenic, n-type zones are locally formed, for example, the zone 103. The resulting stage is shown in FIG. 9.

A layer 105 consisting of high resistance n-type silicon is then deposited in known manner. The thickness of the layer is 2μ. Epitaxial growths are obtained at the area where the semiconductor surface of the body 101 is exposed, polycrystalline zones 106 and 108 being formed on the silicon nitride masking 102. The n-type zones 103 formed in the body 101 constitute a readily conducting n-type buried layer on the lower side of the high-ohmic n-type monocrystalline epitaxial regions 107. The n-type silicon layer 105 is then covered with a silicon nitride layer 110. Windows are provided in said silicon nitride layer at the area of the polycrystalline parts. These windows extend in the longitudinal direction of the polycrystalline strips and may themselves form a network.

Figure 10:
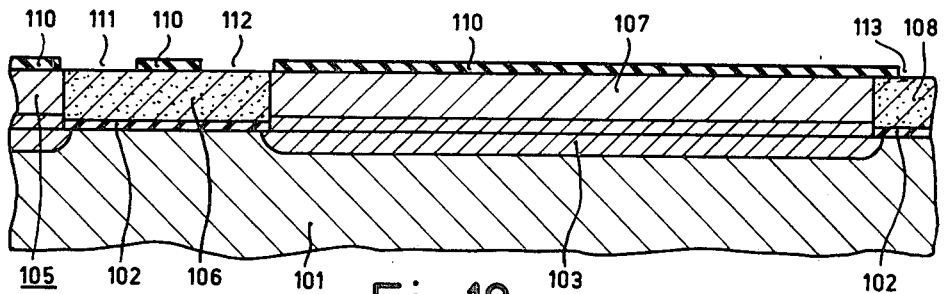

Part of the nitride masking 110, however, may be maintained on the polycrystalline material. A window 113 is provided over the polycrystalline strip 108 in which, however, a peripheral part of the polycrystalline zone 108 beside the monocrystalline region 107 remains covered with the silicon nitride layer over a width of 5μ. Above the polycrystalline region 106 windows 111 and 112 are provided between which a strip of the silicon nitride 110 is maintained. The resulting stage is shown in FIG. 10.

Figure 11:
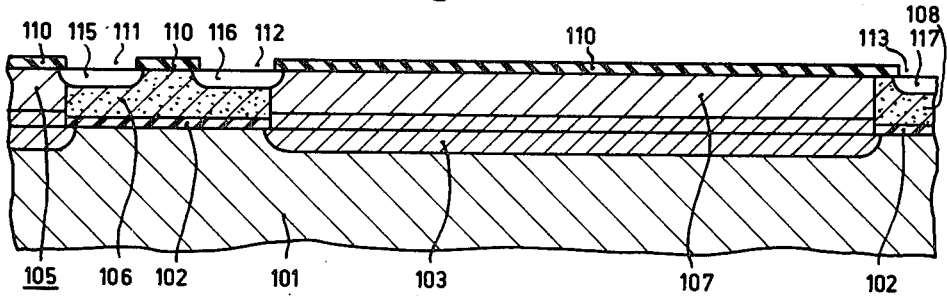
Figure 12:
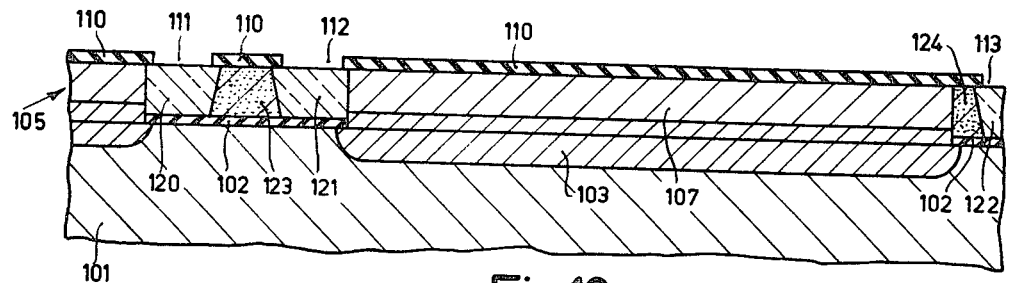

In the windows 111, 112 and 113 the silicon is subjected to an etching treatment, the silicon nitride layer 110 serving as a mask. Grooves 115, 116 and 117 are etched through the windows 111, 112 and 113, respectively, in this manner. The etching process is continued until the grooves have reached a depth of approximately half of the thickness of the provided silicon layer 105. The resulting stage is shown in FIG. 11.

The body is then subjected to an oxidation treatment to form inset insulation layers, the silicon nitride 110 serving as an oxidation mask for this treatment. For that purpose the body is subjected to an oxidation treatment with steam similar to that described above with reference to FIGS. 1 to 8. The temperature used is, for example, 1000° C. and the duration of the treatment is approximately 16 hours. At the area of the grooves 115, 116 and 117 the adjoining silicon is converted to such a depth that the formed oxide adjoins the buried nitride layer 102. As a result of the increase in volume associated with the conversion, the grooves 115, 116 and 117 are entirely filled with silicon oxide. In this manner, at the area of the windows 111, 112 and 113 in the silicon nitride layer 110, inset insulation layers of silicon oxide 120, 121 and 122, respectively, are formed which on their lower side adjoin the buried insulation layer 102. Of the original polycrystalline strip 106 a part 123 remains which is laterally bounded by the inset insulation layers 120 and 121 and is bounded on its upper and lower side by the silicon nitride layers 110 and 102, respectively. A region 124 of the polycrystalline part 108 is maintained between the inset insulation layer 122 and the epitaxially provided part 107 of the layer 105. On its lower side this region is bounded by the buried insulation layer 102 of silicon nitride.

Figure 13:
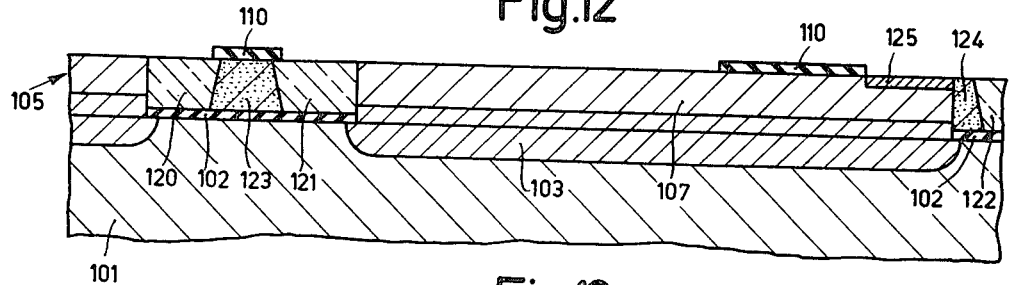

The part of the silicon nitride layer 110 which is present on the polycrystalline region 124 and on an adjoining strip of the monocrystalline n-type region 107 is removed and phosphorus is then indiffused in known manner to form a highly doped n-type layer 125 in the epitaxial region 107, namely according to a strip at the edge along the polycrystalline region 124. Phosphorus will also diffuse in the polycrystalline region 124 but to a greater depth than in the layer 125, since phosphorus diffuses more rapidly in polycrystalline silicon than in monocrystalline silicon. Further parts of the silicon nitride layer 110 are then removed, the strip on the polycrystalline region 123 and a strip on the monocrystalline region 107 present beside the location where the zone 125 was formed by the indiffusion of phosphorus, being maintained. The resulting stage is shown in FIG. 13. It serves as a substrate for the provision of a second semiconductor layer as will be described below.

P-type silicon is deposited on the substrate in known manner such that an epitaxial deposition is obtained on the exposed surface of the monocrystalline parts of the layer 105. In this manner a p-type semiconductor layer is obtained having monocrystalline parts, for example 132 and 134, and polycrystalline parts, for example 131, 133 and 135. The polycrystalline part 131 is formed on the insulation layer 120 from inset silicon oxide, the part of the silicon nitride layer 110 which is present on the polycrystalline region 123 and on the insulation layer 121 consisting of inset silicon oxide. A monocrystalline region 132 having a resistivity of 0.5 ohm cm is formed on the part of the uncovered surface of the n-type monocrystalline layer 107 where this material is high-ohmic. This surface part is present between the inset insulation layer 121 and the remaining part of the silicon nitride layer 110 remaining on the surface of the region 107. On the last-mentioned part of the silicon nitride layer 110 is formed a region 133 of polycrystalline silicon. A part of epitaxial silicon 134 is deposited on the highly doped monocrystalline n-type zone 125. By possible diffusion of phosphorus in the epitaxially deposited material, the highly doped n-type zone may have expanded in the p-type epitaxially deposited part 134. A polycrystalline region 135 is formed on the polycrystalline region 124 of the substrate and on the oxide layer 122 inset in the substrate.

Figure 14:
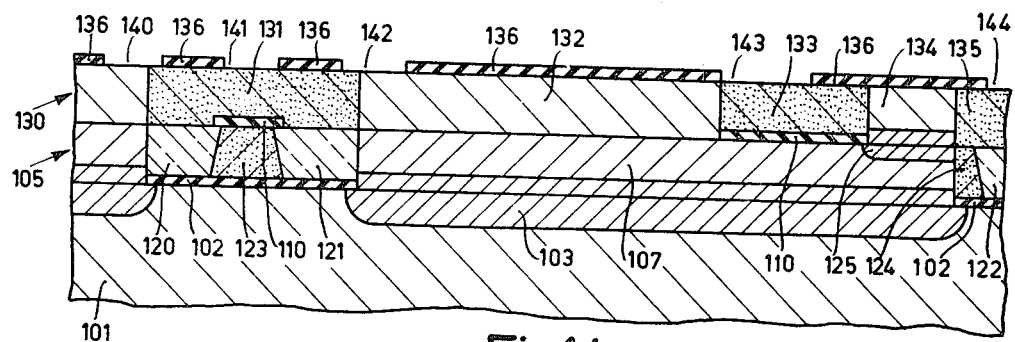

A silicon nitride layer 136 is next deposited on the silicon layer 130 and is used again as a mask for the formation of inset insulation layers. For this purpose windows are etched in the silicon nitride layer 136, which windows mutually may form a network. Thus strip-shaped windows 140 and 142 are provided along the edge of the polycrystalline region 131 and above a peripheral zone of the adjacent monocrystalline parts of the layer 130. The window 142 is present above a peripheral zone of the region 132. A strip-shaped window 141 is provided approximately straight above the polycrystalline buried region 123. A strip-shaped window 143 is provided above the polycrystalline region 133, an edge of the window forming approximately the elongation of the junction of the polycrystalline region 133 with the monocrystalline region 132. Furthermore a window 144 is provided above the polycrystalline region 135 at some distance from the boundary between the polycrystalline region 135 and the monocrystalline region 134. The resulting stage is shown in FIG. 14.

Figure 15:
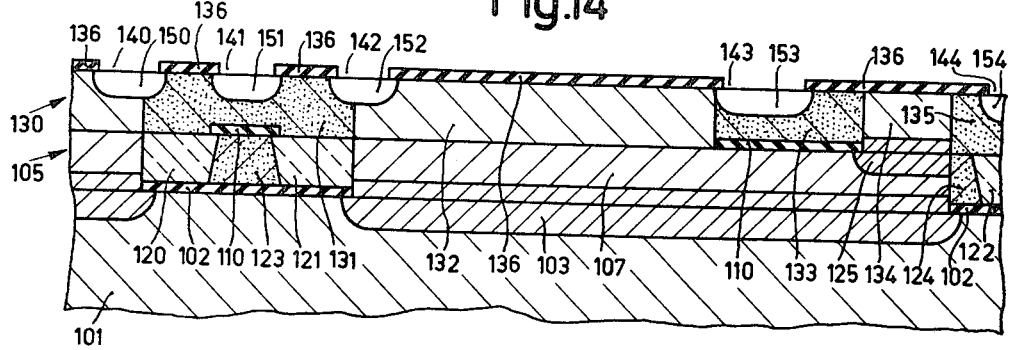

Grooves are then etched in the silicon of the layer 130 via the window provided in the silicon nitride layer 136. The etching treatment is continued until well over half of the thickness of the layer 130 is removed. In this manner the grooves 150, 151, 152, 153 and 154 are formed in the windows 140, 141, 142, 143 and 144, respectively. The resulting stage is shown in FIG. 15.

Figure 16:
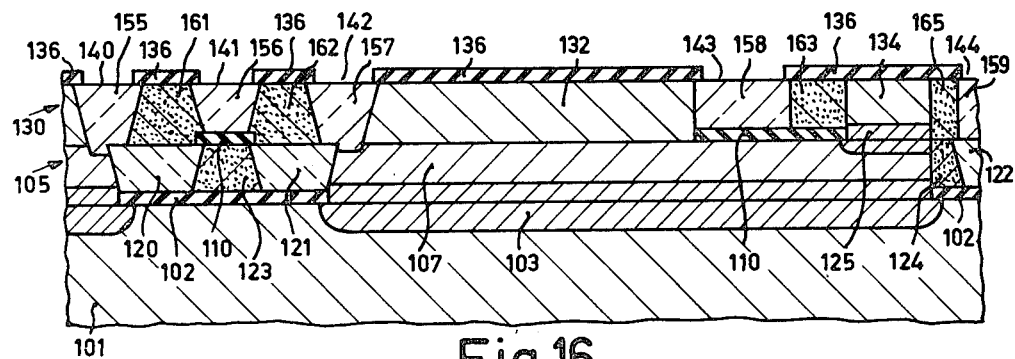

A deeper oxidation treatment is then used again, the silicon nitride 136 serving as a mask and the provided grooves being filled again by the formed silicon oxide. In this manner the inset insulation layers 155, 156, 157, 158 and 159, respectively, of silicon oxide are formed at the area of the windows 140, 141, 142, 143 and 144, respectively. The resulting stage is shown in FIG. 16. The inset insulation layer 155 adjoins the buried insulation layer 120 which is inset in the substrate. The inset insulation layer 156 adjoins the buried silicon nitride layer 110 which is present on the substrate. The inset insulation layer 157 adjoins the buried insulation layer 121 which is inset in the substrate. The polycrystalline part 131 of the silicon layer 130 is divided as a result into two polycrystalline strips 161 and 162 which are surrounded by insulation material laterally and on its bottom side. The oxidation process is continued until the formed inset insulation layers 155 and 157 beside the buried insulation layer 120 and 121 have slightly penetrated into the first provided silicon layer 105. The formed insulation layer 158 adjoins with its lower side the buried nitride layer 110. Of the polycrystalline region 133 is maintained a region 163 which is separated from the monocrystalline region 132 by the inset insulation layer 158. The inset insulation layer 159 adjoins with its lower side the buried insulation layer 122 which originally was inset in the substrate. Of the polycrystalline region 135 remains a region 165 which laterally adjoins the inset insulation layer 159 and the monocrystalline p-type region 134 and which adjoins on its lower side the polycrystalline region 124 of the silicon layer 105.

From the stage reached now which is shown in FIG. 16, the semiconductor device to be manufactured can be obtained by further local diffusion processes and providing contacts. The regions 132 and 107 are further processed to the structure of an n-p-n transistor. The n-type region 107 is used for the formation of the collector and the p-type region 132 is used for the formation of the base.

Figure 17:
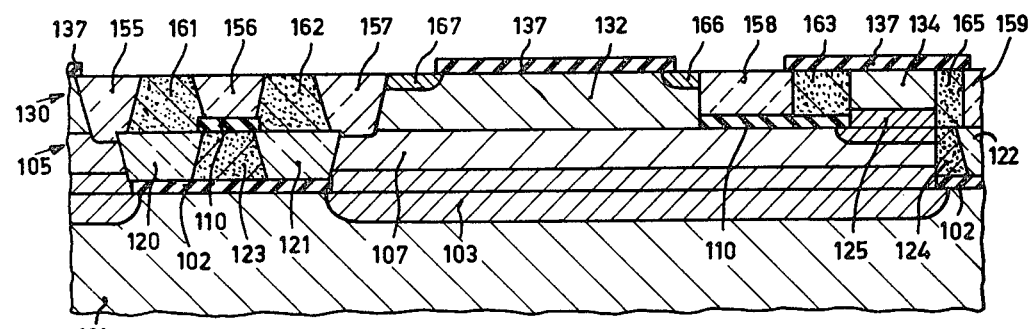

A low-ohmic p-type zone which surrounds the emitter to be manufactured afterwards is first provided. The silicon nitride layer 136 is removed entirely and a fresh masking layer 137, for example of silicon oxide, is provided at the area where the silicon emerges at the surface. A peripheral part of the part of the masking layer 137 which covers the region 132 is removed so that a peripheral zone of the surface of the region 132 is exposed which is present beside the inset insulation layers 157 and 158. This peripheral zone is given a local widening, for example, adjoining the inset insulation layer 157 so as to be able to provide a base contact at the area. Furthermore the masking layer 137 is removed from the polycrystalline zones 161 and 162. Boron is then indiffused in known manner except where the mask 137 is present. As a result of this a narrow zone 166 present at the surface is formed along the edge of the region 132 which zone consists of low-ohmic p-type silicon. It has a widened part 167 for providing a contact afterwards. Boron diffuses simultaneously in the polycrystalline zones 161 and 162 which as a result of the high diffusion rate of boron in polycrystalline silicon become low-ohmic p-type throughout their thickness. The resulting stage is shown in FIG. 17.

The masking layer 137 is now removed entirely after which a silicon oxide layer 170 is formed on the exposed silicon parts, for example, by means of a conventional oxidation process by means of a gas mixture from water vapour and nitrogen. This oxide layer has a thickness, for example, of $0.3\mu$. By means of a conventional photoetching method the oxide layer 170 is entirely removed from the silicon regions present between the inset insulation layers 158 and 159. At the same time, a window 171 is provided in the part of the oxide layer present on the region 132 which window has laterally remained at a small distance from the highly doped p-type peripheral zone 166. Phosphorus is then indiffused in the usual manner, the remaining silicon oxide layer 170 serving as a mask. A p-type emitter 173 is formed in the region 132. At the same time a low-ohmic n-type region 174 present at the surface is formed in the region 134. The phosphorus simultaneously diffuses in the exposed polycrystalline regions 163 and 165. As a result of the larger diffusion rate of phosphorus in polycrystalline silicon, said regions are doped with phosphorus throughout their depth in a comparatively high concentration.

Figure 18:
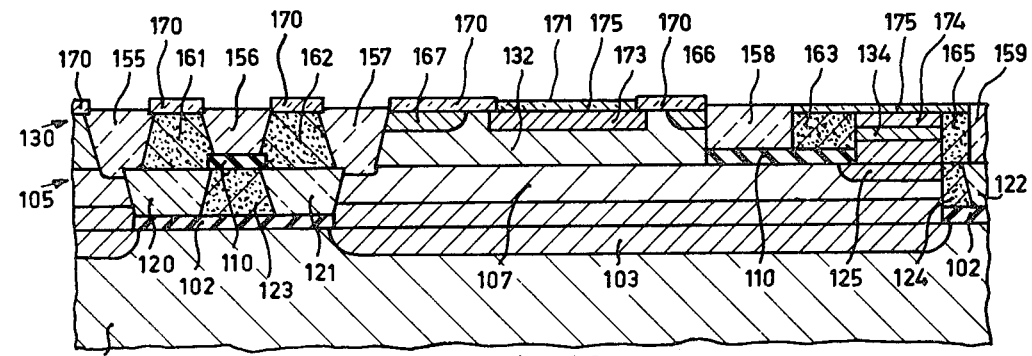

Should in the monocrystalline region 134 the diffusion of the phosphorus from the surface and the diffusion of the phosphorus from the buried layer 125 be insufficient to make the region 134 entirely n type, as a result of which a thin p-type zone would remain, a sufficiently conductive connection would all the same be obtained between the regions 174 and 125 via the re-doped polycrystalline regions 163 and 165. The resulting stage is shown in FIG. 18. During the phosphorus diffusion a thin phosphate glass layer 174 may be formed on the free surface parts.

In the silicon oxide layer 170 a window is etched which provides access to the widening 167 of the highly doped peripheral zone 166 of the base region 132. Furthermore, by means of a short etching treatment using an agent which can dissolve in particular the phosphate glass layer 175, the emitter window 171 can be opened and the surface of the n-type zones 163, 174 and 165 be exposed.

By vapour depositing suitable metal, for example aluminum, contacts may then be provided, namely an emitter contact 180 on the emitter 173, a base contact 181 on the highly doped base contact 167, and a collector contact 182 on the free surface of the polycrystalline n-type regions 163 and 165 and on the highly doped monocrystalline n-type region 174. This collector contact is connected, via said regions 174, 163 and 165, with the uppermost highly doped n-type buried layer 125 which in turn is in contact, possibly via a remaining thin epitaxial n-type zone but, in the case of sufficient diffusion, possibly also directly, with the lowermost n-type buried layer 103 which ensures a decreased collector-series resistance with the part of the collector region 107 which adjoins the base region 132. Metal strips for interconnections, if any, to other parts of the semiconductor device or to connections situated elsewhere are also provided. For example, the collector contact 182 may be connected via a connection strip 184 which is conducted, for example, over the inset insulation layer 159. The base contact 181, for example, may be provided with a connection strip 183.

Figure 19:
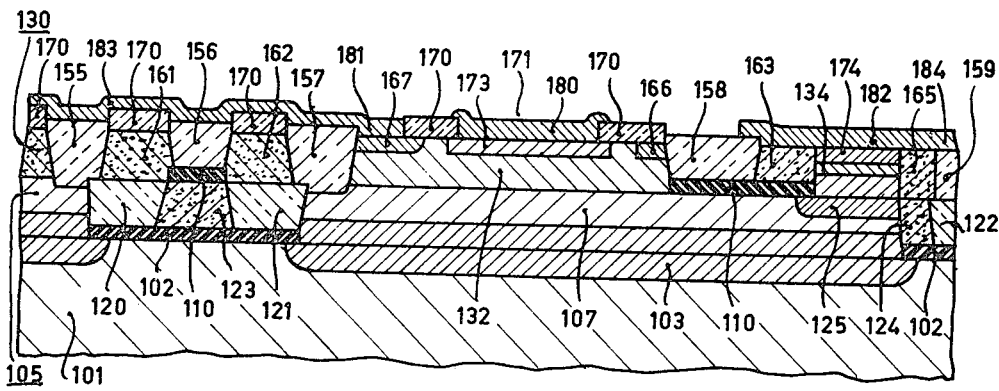

The remaining semiconductor device is shown in FIG. 19. This FIG. shows an n-p-n transistor which is laterally bounded by insulation zones adjoining the p-type material 101 which in known manner isolates the transistor on its lower side by means of the p-n junction between the p-type material 101 and the n-type material of the buried layer 103. The insulation zones which laterally insulate the n-p-n transistor are composed of the insulation layers 157 and 159 consisting of silicon oxide obtained by conversion of silicon and inset in the upper silicon layer 130, the buried insulation layers 121 and 122, respectively, consisting of silicon oxide obtained by conversion of silicon and inset in the lower silicon layer 105, and the adjoining silicon nitride layer 102. Between the p-type region 132 and the n-type region 107 a flat collector-base junction is present which is bounded at one side by the inset insulation layer 157 and on the other side by the buried silicon nitride layer 110. The inset insulation layer 158 and the adjoining buried silicon nitride layer 110 constitute a lateral insulation which consists entirely of insulation material, between the upwardly conducted collector contacting zone and the base region. Since the base region 132 is surrounded by insulation material also laterally, namely by the inset insulation layers 157 and 158, it is permissible to provide the low-ohmic zone 166 and 167 which surrounds the emitter 173 along the edge of the base region. If desired, the base contact 181 may extend to other parts of the low-ohmic peripheral zone 166, if possible along said entire zone, it being permissible for said contact to expand partly over the adjacent inset insulation layer. As a result of the thickness of said insulation layer, such an expansion produces no noteworthy increase of stray capacitance while the advantage of a decrease of the base-series resistance is obtained.

The buried polycrystalline strip 123 is entirely surrounded by insulation material both on its upper side and its lower side and laterally. As a result of the low doping of said polycrystalline material, said strip 123 may be used as a resistor. It may be connected locally, for example, by local, lateral interruption of one of the buried insulation layers 120 or 121 or via a connection upwards, if desirable via a conducting strip to the surface, in a manner corresponding to that of the connection of the inset polycrystalline layer 124 via the polycrystalline layer 165 to the metal contact 182. The inset polycrystalline regions 161 and 162 are also fully surrounded by insulation material laterally and on their upper and lower sides. They are comparatively highly p-type doped and may be used as conductive connections. Since they are further inset in the semiconductor body, crossing wirings may be obtained without providing an extra level above the wafer. For example, the conductive strip 183 may cross the conductors 161 and 162 and nevertheless remain at approximately the same level as the further metal conducting strips.

Figure 20:
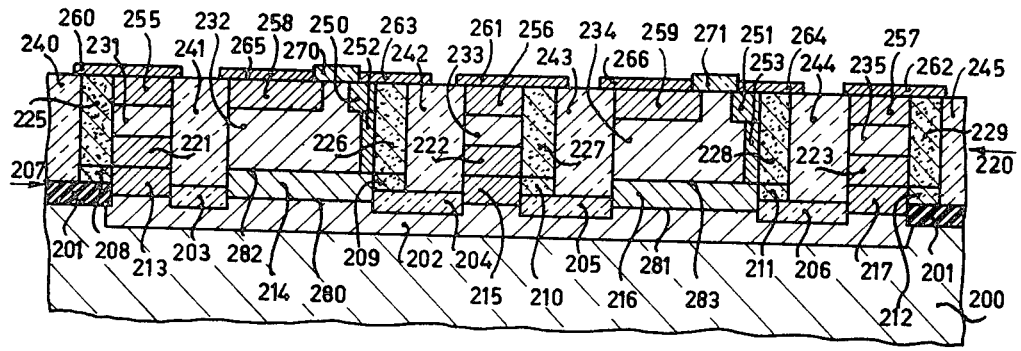
FIG. 20 shows a semiconductor device having so-called "inverted" transistors having a common emitter.

FIG. 20 shows diagrammatically and by way of example a part of a semiconductor device according to the invention comprising a number of n-p-n transistors having a common emitter. When such transistors are incorporated in known manner transversely in a semiconductor body, the collectors are usually formed in the deeper parts, the emitters are formed at the surface and the bases inbetween them. Beside the actual transistor part with the emitter, base and collector zones present one above the other, contact regions for base and collector are used which emerge at the surface for providing contacts, said regions constituting an electric connection between the contacts and the actual base collector region, respectively. The emitter regions present at the surface are surrounded laterally by the associated bases. For circuit arrangements comprising a number of similar transistors having a common emitter, said separate emitter regions should be coupled together by metal wiring by means of conventional metal strips provided on insulation. As a result of this the integrated circuit becomes complicated as regards the conducting pattern used and crossing wires are even necessary sometimes. In order to simplify the wiring an inverted structure can rather be used in which the emitter is provided deeper in the semiconductor body and the collector is provided at the surface. The common emitter may then have the form of a buried readily conducting layer above which the separated bases and collectors are provided. Since in such planar structures the base regions were entirely surrounded by the common emitter, while the collectors were provided in the base regions, the base-collector junction of eac transistor was small as compared with the base-emitter junction which was less favourable for a good amplification factor. By means of inset insulation layers, in particular when same adjoin buried insulation layers, it is possible to obtain an improved structure of a number of similar transistors having a common and buried emitter. This will be explained with reference to FIG. 20.

Reference numeral 200 in FIG. 20 denotes a substrate body which consists of monocrystalline p-type silicon having a resistivity of 2–5 ohm cm. On this body a silicon nitride masking 201 is provided in known manner, in a window of which a highly doped n-type zone 202 is provided by indiffusion of arsenic. On this an oxide pattern of boron-containing silicon oxide is provided in known manner as a result of which an oxide pattern in the form of a grating or mesh of strips 203, 204, 205 and 206 is formed on the highly doped n-type layer 202. A high-ohmic p-type silicon layer having a thickness of $0.5\mu$ is then provided in known manner. On the exposed silicon of the monocrystalline substrate body the deposited silicon of the layer 207 is epitaxial and on the now buried insulation layers of silicon nitride and boron-containing silicon oxide, the deposit is polycrystalline. The resistivity of the monocrystalline p-type silicon is 0.5 ohm cm. In this manner monocrystalline regions 213, 214, 215, 216 and 217 which are separated from each other are formed. The regions 214 and 216 are destined for the bases of the transistors to be manufactured, the buried n-type layer 202 of which forms the common emitter. Phosphorus is indiffused in the regions 213, 215 and 217. A layer 220 of high-ohmic n-type silicon is then deposited, the deposit on the monocrystalline parts of the previously provided layer 207 being epitaxial, and the deposit on the polycrystalline parts of the layer 207 being polycrystalline. The thickness of the layer 220 is $1.5\mu$. An inset oxide pattern is then provided in the two layers 220 and 207 in the above described manner by means of a silicon nitride masking, etching grooves, and a deep oxidation. The inset insulation layers 240, 241, 242, 243, 244 and 245 are obtained which adjoin on their lower sides the buried insulation layers 201, 203, 204, 205, 206 and 201, respectively.

The n-type regions formed by diffusion of phosphorus after the deposition of the layer 207 have formed highly doped buried layers 221, 222, and 223 in the epitaxially deposited silicon. The phosphorus has also diffused in the adjacent polycrystalline regions. The said inset insulation layer have divided the provided silicon layers 207 and 220 into silicon islands. A first island consists of the zones 208 and 213 which are parts of the provided layer 207 and the zones 225 and 231 which are parts of the provided layer 220. A second island consists of the zones 214 and 209 which are parts of the layer 207, and the zones 232 and 226 which are parts of the layer 220. A third island consists of the zones 215 and 210 which are parts of the layer 207, and the parts 233 and 227 which are parts of the layer 220. A fourth island consists of the zones 216 and 211 which are parts of the layer 207, and the zones 234 and 228 which are parts of the layer 220. A fifth island consists of the zones 217 and 212 which are parts of the layer 207 and the zones 236 and 229 which are parts of the layer 220.

The silicon nitride mask is then removed and by means of conventional oxide masks, boron is now first locally diffused in the zone 226 and an adjoining part 250 of the zone 232 and in the zone 228 and an adjoining part 251 of the zone 234. Phosphorus is finally diffused in the zones 225, 231, 233, 227, 257 and 229 and furthermore in a part 258 of the zones 232 and in a part of the zone 234.

The semiconductor body has now obtained the configuration shown in FIG. 20. In two islands transistor configurations have been obtained in which the buried n-type layer 202 forms a common emitter. The epitaxially provided p-type regions 214 and 216 form the bases. Since the arsenic doping in the buried layer 202 has a small diffusion coefficient, the comparatively high-ohmic p-type regions 214 and 216 which form parts of the provided layer 207 are only partly re-doped by diffusion from the layer 202 during the thermal treatments for the formation of the semiconductor device. The expansion of the n-type buried layer 202 in the epitaxially provided parts 214 and 216 is approximately $0.2\mu$. The remaining p-type zones which have thicknesses of approximately $0.3\mu$ constitute the bases of the two transistors. The epitaxially provided n-type parts 232 and 234 constitute the collectors of the transistors.

The two islands in which the transistor structures are provided comprise two polycrystalline zones 209 and 211, respectively, of the thin layer 207 and 226, respectively, 228 of the layer 220. These zones are provided on the buried insulation layer 204 and 206, respectively, of boron-containing silicon oxide. The region 209 and 211, respectively, consists of p-type polycrystalline silicon, also since boron has diffused from the buried insulation layer 204 and 206, respectively, in the polycrystalline zone 209 and 211, respectively. The polycrystalline zones 226 and 228 are highly doped p-type as a result of the last diffusion treatment with boron from the surface of the layer 220. The boron may also contribute to increase the acceptor concentration in the zones 209 and 211. The boron may furthermore have diffused from the polycrystalline zones 226 and 228 in the adjacent n-type regions 232 and 234, respectively, the zones 252 and 253, respectively, being formed from p-type silicon.

During the phosphorus diffusion in the layer 220 the highly doped n-type zones 258 and 259 have formed in the n-type epitaxial parts 232 and 234, respectively. These zones are separated by high-ohmic n-type material from the epitaxially provided zones 232 and 234, respectively, of the highly doped p-type surface zones 250 and 251, respectively. The regions 258 and 259 serves as collector contact zones.

The low-ohmic n-type buried layers 221, 222 and 223 which are doped with the comparatively rapidly diffusing phosphorus have expanded to the buried emitter 202 so that the regions 213, 215 and 217 consist entirely of comparatively highly doped n-type material. In a corresponding manner the polycrystalline regions 208, 210 and 212 are highly doped with phosphorus. As a result of the diffusion of phosphorus in the layer 220, the highly doped zones 255, 256 and 257 are formed in the monocrystalline regions 231, 233 and 235. As a result of the higher diffusion rates in polycrystalline material, the polycrystalline zones 225, 227 and 229 are highly doped with phosphorus throughout their thickness.

Ohmic contacts are provided, namely ohmic contacts 260, 261 and 262 to the highly doped zones 255 and 225, 256 and 227 and 257 and 229, respectively. These constitutes three emitter contacts which are connected in a readily conducting manner to the common emitter 202 via highly doped n-type zones, namely via the zones 255, 225, 208 and 226, via the zones 256, 227, 210 and 222, and via the zones 257, 229, 212 and 223, respectively.

The contacts 263 and 264 constitute the base contacts of the two transistors. The contacts 263 and 264 are connected in a readily conducting manner to the p-type base zones 214 and 216, respectively, via the highly doped p-type zones 250, 226, 252 and 209 and via the highly doped p-type zones 251, 228, 253 and 211, respectively.

The metal layers 265 and 266 are laterally separated by the silicon oxide layers 270 and 271 from the base contacts 263 and 264, respectively. These collector contacts 265 and 266 constitute good ohmic contacts to the highly doped n-type contact regions 258 and 259, respectively, of the collector regions 232 and 234.

The emitter 202 forms flat junctions with the bases 214 and 216, which junctions 280 and 281, respectively, are present, substantially throughout their surface, at a short distance opposite to the base-collector junctions 282 and 283, respectively. The emitter contacts have through-connections to the buried emitter layer 202 which are separated laterally from the transistor configurations by zones of insulating material.

The base-collector capacitances in this construction may be even further reduced by using further inset oxide layers, if desirable also provided on a thin buried insulation layer, which inset insulation layers are inset throughout the thickness of the layer 220 or if desirable over a part of said thickness and laterally separate the base contact zones from the collector regions. As a result of this it is even possible to obtain a substantially flat collector-base junction with a minimum capacity bounded by insulating material along its entire circumference.

It is to be noted that the use of two or more inset insulation layers one on the other enables the use of a thicker collector regions which may be desirable for obtaining high reverse voltages across the base-collector junction, In the resulting construction the emitterbase junctions are only slightly larger than the oppositely located part of the base-collector junction, as a result of which reasonable current amplification factors of the transistors can be obtained.

Figure 21:
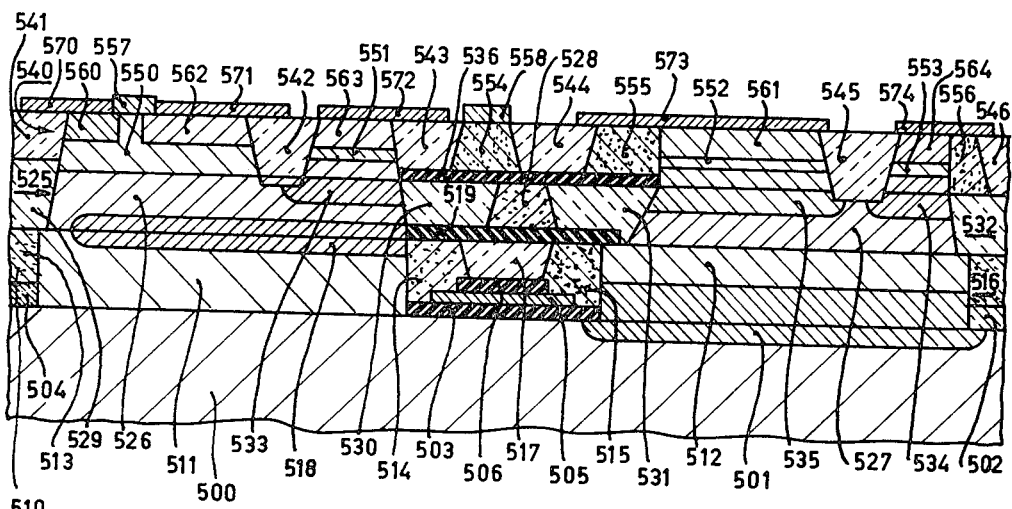
FIG. 21 shows a semiconductor device comprising an n-p-n transistor and a p-n-p transistor the collectors of which are connected together below the level of the semiconductor surface so as to be readily conducting.

FIG. 21 shows a semiconductor device having an n-p-n and a p-n-p transistor the collectors of which are conductively connected together. Since the two collector regions in such a case consist of semiconductor material of different conductivity types, a direct contact between said collectors would form a rectifying junction. When proceeding according to conventional integration methods, collector contacting zones present at the surface could be interconnected by means of a metallic connection conductor conducted over an insulation layer. When using inset and buried insulation layers according to the present invention it is also possible to bury metal conductors. These may interconnect deeper located zones, in particular zones of different conductivity types.

The semiconductor device partly shown in FIG. 21 is constructed on a monocrystalline semiconductor body 500 of high-ohmic n-type silicon. By oxidation and masked etching in the usual manner, conventional, comparatively thin, oxide layers 502 and 504 are provided thereon. An insulation layer 503, consisting of silicon nitride is furthermore provided in the form of a strip. A metal conductor 505, for example of tungsten or molybdenum, is provided in known manner on said layer of silicon nitride. Between the silicon nitride and the metal, a thin silicon oxide layer may be provided, if desirable. Since at least a peripheral zone of the upper surface of the insulation layer 503 remains free from the provided metal, there is no direct shortcircuit between the metal layer and the n-type material 500 of the silicon body. The metal layer 505 is again covered with an insulating strip 506, for example likewise consisting of silicon nitride, having below it, if desirable, a thin layer of silicon oxide. On the upper side of the metal layer 505 two surface parts which are separated from each other have remained free from the insulation material of the layer 506. Furthermore, a p+-type zone 501 is provided in a part of the surface of the body 500 between the insulation layers 502 and 503 by diffusion of boron.

On this a silicon layer 510 of the p-type, for example, having a thickness of $2\mu$ is provided such that polycrystalline silicon is deposited on the surfaces with insulation material or metal and epitaxial silicon is deposited on the free monocrystalline silicon surface. A polycrystalline part 513 has formed on the oxide layer 504, On the part of the silicon surface present between the oxide layer 504 and the silicon nitride 503 a monocrystalline p-type region 511 has formed epitaxially during the deposition. It consists of p-type material having a resistivity of 0.5 ohm cm. A polycrystalline region 516 has formed on the oxide layer 502. An epitaxial silicon part 512 of high-ohmic p-type silicon has formed on the surface part of the silicon body present between the silicon nitride layer 503 and the oxide layer 502. The buried low-ohmic p-type layer 501 has expanded by diffusion in the part 512. A part of polycrystalline silicon has deposited on the free surfaces of the silicon nitride layer 503, the metal layer 505, and the silicon nitride layer 506.

A network consisting of inset insulation layers is again provided in the layer 510, which network has been obtained by local etching of grooves and deep oxidation of the silicon. For example, an inset insulation layer 517 is inset in the layer 510, said layer 517 adjoining on its lower side the silicon nitride layer 506 provided on the metal. The polycrystalline silicon region in which the insulation layer 517 is inset, is divided into two parts, the polycrystalline part 514 of which adjoins the epitaxial part 511 of the layer 510, and the polycrystalline part 515 of which adjoins the epitaxial part 512 of the layer 510.

By means of conventional planar diffusion methods, the polycrystalline zones 513, 515 and 516 are highly doped with boron, while phosphorus is indiffused in the polycrystalline part 514 and in the adjoining monocrystalline epitaxial part 511, with the exception of a surface part adjoining the polycrystalline region 513. As a result of the difference in diffusion rate of the phosphorus, the polycrystalline region 514 has entirely become low-ohmic n-type while at the surface of the monocrystalline p-type region 511 a highly doped n-type zone 518 has formed.

The polycrystalline highly doped n-type zone 514 is now connected in a readily conductive manner to the highly doped polycrystalline p-type zone 515 via the buried metal layer 505.

A silicon nitride layer 519 is provided on the polycrystalline regions 514 and 515 and the intermediately located inset insulation layer 517. A layer 525 of high-ohmic n-type silicon is then provided on the assembly. The parts of said layer which are provided on insulation material and on polycrystalline material become polycrystalline, while the parts which are provided on monocrystalline silicon have deposited epitaxially on said monocrystalline silicon. For example, on the monocrystalline part 511 of the layer 510 the epitaxial monocrystalline high-ohmic n-type region 526 has formed and on the monocrystalline part 512 of the layer 510 the monocrystalline region 527 of high-ohmic n-type silicon has formed. The zone 518 has expanded by diffusion both in the region 511 and in the region 526 and constitutes a highly doped n-type buried layer.

In the above-mentioned manner, by providing grooves and deep oxidation, inset insulation layers of silicon oxide have formed in the silicon layer 525, namely in a pattern of a network. The inset insulation layer 529 adjoins with its lower side the highly doped p-type polycrystalline silicon zone 510 and a buried insulation layer inset in the silicon layer 510 (not shown) which adjoins with its lower side the buried insulation layer 504. The buried polycrystalline zone 513 forms a conductive connection passing through an interruption of said buried insulation layer inset in the silicon layer 510. In a corresponding manner, the polycrystalline highly doped p-type zone 516 may have the form of a passage through a buried insulation layer (not shown) inset in the silicon oxide layer 510 and adjoining the thin buried oxide layer 502 with its lower side. The insulation layer 532 inset in the silicon layer 523 adjoins with its lower side said buried layer inset in the layer 510 and the polycrystalline zone 516. In the polycrystalline part formed on the silicon nitride layer 519, two inset insulation layers 530 and 531 are formed of which the layer 530 laterally adjoins the epitaxially provided part 526 and the inset insulation layer 531 laterally adjoins the monocrystalline part 527 of the layer 525. Between the inset insulation layers 530 and 531 a comparatively high-ohmic n-type polycrystalline zone 528 has been retained which expands between said two buried layers 530 and 531 as an elongated part which may be used as a resistor.

Highly doped zones have formed locally from the surface of the layer 525, namely the highly doped n-type zones 533 and 534 in a surface part of the epitaxially provided n-type region 526, which surface part adjoins the inset insulation layer 530, respectively in a surface part of the epitaxial n-type region 527, which surface part adjoins the inset insulation layer 532. Furthermore, a highly doped n-type zone 535 which with some intermediate space is separated from the highly doped n-type zone 534 has formed by indiffusion ofnboron in a surface part of the epitaxially provided region 527. A silicon nitride layer 536 is provided on the zone 528 of polycrystalline silicon and on the inset insulation layers 530 and 531.

A layer 540 of p-type silicon has been deposited on the layer 525. Where this silicon is deposited on insulation material, the deposit is polycrystalline. Where the deposition took place on monocrystalline silicon, monocrystalline parts were formed epitaxially on the substrate. The highy doped p-type zone 535 and the highly doped n-type zones 533 and 534 may have expanded by diffusion of boron and phosphorus, respectively, in the silicon of the layer 540.

By providing grooves in the above described manner and by deep oxidation at the area of said grooves while using a suitable masking, for example silicon nitride, a network of insulation layers of silicon oxide inset in the silicon layer 540 was formed. The inset insulation layer 541 adjoins with its lower side the insulation layer 529 inset in the silicon layer 525. The insulation layer 542 inset in the layer 540 extends to just below the boundary between the layer 525 and the layer 540. It is provided in the monocrystalline part of the layer 540 grown epitaxially on the region 526 and on its lower side reaches near the edge of the now buried zone 533 which is highly doped with phosphorus. The inset insulation layer 542 divides the monocrystalline region provided epitaxially on the monocrystalline part 526 of the layer 525 into two parts of which a part 550 of high-ohmic p-type material having a flat junction adjoins the high ohmic n-type material of the region 526 and the part 551 of high ohmic p-type material adjoins with its lower side the buried layer 533 of highly doped n-type material. The monocrystalline part 551 of the silicon layer 540, which part 551 adjoins on its one side the inset insulation layer 542 adjoins with its other side the inset insulation layer 543 which adjoins with its lower side an edge of the silicon nitride layer 536. The inset insulation layer 544 adjoins with its lower side a central part of the buried silicon nitride layer 536. As a result of this the silicon deposited polycrystalline on the silicon nitride layer is divided into a region 554 which is bounded on either side by inset insulation layers 543 and 544, and a region 555 which adjoins the monocrystalline material deposited on the monocrystalline region 527 of the silicon layer 525. The inset insulation layer 545 is provided in said monocrystalline part of the layer 540 deposited epitaxially on the monocrystalline part 527. It is inset to just below the boundary between the silicon layers 525 and 540 and adjoins with its lower side the edge of the now buried highly doped p-type layer 535 and the edge of the now buried highly doped n-type layer 534. It furthermore adjoins with its lower side the high-ohmic p-type material of the region 527 present between said buried layers. The inset insulation layer 545 divides the monocrystalline part of the layer 540 grown epitaxialy on the monocrystalline region 527 into two parts, the part 552 of which laterally adjoins the polycrystalline zone 555 and adjoins with its lower side the buried low-ohmic p-type layer 535, and the part 553 of which adjoins with its lower side the buried low-ohmic n-type layer 534. The insulatin layer 546 is inset in the polycrystalline part of the silicon layer 540 which is deposited on the now buried insulation layer 532 inset in the silicon layer 525. The inset insulation layer 546 adjoins with its lower side said buried insulation layer 532. A zone 556 of polycrystalline silicon present above a peripheral part of the buried insulation layer 532 is present between the inset insulation layer 546 and the monocrystalline part 553 of the silicon layer 540.

By local indiffusion of phosphorus and boron according to known planar methods, highly doped n-type zones and p-type zones, respectively, are locally formed in the silicon layer 540. By indiffusing phosphorus, the polycrystalline zone 556 is doped highly with phosphorus throughout its thickness. By diffusion throughout the surface of the region 533, a highly doped n-type zone 564 is formed which laterally adjoins on one side the inset insulation layer 545 and on the other side adjoins the polycrystalline silicon of the zone 556 which is likewise highly doped with phosphorus. It is possible to continue the diffusion until the high-ohmic p-type silicon of the region 553 has been fully re-doped by the upwards diffusion of phosphorus from the buried layer 534 and the downwards diffusion of phosphorus from the layer 564. It is possible, however, that a p-type zone of the original material of the region 553 remains and that the polycrystalline part 556 ensures a readily conducting connection between the zone 564 and the buried part 534.

Such a highly phosphorus-doped zone 563 is formed by indiffusion of phosphorus throughout the surface of the monocrystalline part 551 of the layer 540. In this case also the p-type material of the region 551 can be fully re-doped by downwards diffusion of phosphorus from the layer 563 and upwards diffusion of phosphorus from the layer 533. However, should a thin zone of p-type material remain, as is shown diagrammatically in FIG. 23, it can be better ensured that between the monocrystalline part 551 of the layer 540 and the inset insulation layer 543 a zone of polycrystalline silicon remains on a peripheral part of the silicon nitride layer 536. During the phosphorus diffusion to form the layer 536 this may be doped with phosphorus throughout its thickness. In this manner it can be ensured that a good ohmic contact is obtained between the n-type zone 563 and the buried n-type layer 533. This layer 533 may have expanded downwards down to the buried n-type layer 518 present underneath so that the last-mentioned layer 518 has a readily conducting connection to the surface of the layer 540 for providing a contact.

By indiffusing phosphorus in a surface part of the region 550 adjoining the inset insulation layer 542, the highly doped n-type zone 562 is formed which forms a p-n junction with the high-ohmic p-type material of the region 550.

By indifusing boron throughout the surface of the monocrystalline part 552, a highly doped p-type surface zone 561 is formed which may possibly be separated from the buired p-type layer 535 by a thin layer of high-ohmic p-type material. By the simultaneous diffusion of boron in the polycrystalline zone 555 which becomes doped highly with boron throughout its thickness, a readily conducting connection is ensured between the buried layer 535 and the surface zone 561.

The boron may also be diffused in the polycrystalline zone 554 to form a conductive strip which is entirely bounded by insulation material laterally and from below and which may serve as a conductor inset in the semiconductor body. The zone 554 may furthermore be covered on its upper side with an insulation layer 558, for example of silicon oxide. The zone 554 may also be masked against the boron diffusion as a result of which the material maintains its comparatively high resistivity and the zone 554 may, if desired, be used as a resistor.

In a peripheral zone of the surface of the monocrystalline part 550 of the silicon layer 540, which peripheral zone adjoins the inset insulation layer 541, boron is also diffused to form a highly doped p-type zone 560 which remains at a small distance from the highly dope n-type zone 562.

The resulting configuration comprises a p-n-p transistor comprising the buried layer 535 as an emitter, the high-ohmic n-type material of the region 527 as a base and the p-type region 512 present underneath as a collector. An ohmic emitter contact 573 is provided on the surface of the polycrystalline zone 555 and the highly doped p-type zone 561. Via these zones the emitter contact 573 is connected to the buried emitter layer 535 in a readily conducting manner. The base contact 574 is provided on the highly doped n-type zone 564 and the polycrystalline zone 556. The base contact 574 is connected to the base region 527 in a readily conducting manner via the zone 564, the polycrystalline zone 556 and the highly doped n-type buried layer 534. The base region 527 is separated from the high-ohmic collector region 512 by an entirely flat p-n junction. The low-ohmic p-type buried layer 501 serves to reduce the collector-series resistance.

Via the buried conductor 516 of polycrystalline low-ohmic p-type silicon, the collector may be connected to other circuit elements. For the rest the p-n-p transistor is present in an island which adjoins the n-type body 500 on its lower side with a p-n junction. On one de the island is bounded by an isolation zone which is interrupted only locally by the conductive collector connection 516 but otherwise consists entirely of insulation material formed by the thin oxide layer 502, the insulation layer (not shown) inset in the layer 510 down to the insulation layer 502 as a result of which the conductor 516 is formed, the buried insulation 532 inset in the layer 525, and the insulation layer 546 inset in the layer 540.

The configuration furthermore comprises an n-p-n transistor. The emitter thereof is formed by the highly doped n-type zone 562, the base is formed by the high-ohmic n-type region of the part 550 below the emitter, and the collector is formed by the high-ohmic n-type part 526 of the layer 525 present underneath. An emitter contact 571 is provided on the highly doped n-type emitter zone 562. A base contact 570 is provided on the highly doped n-type peripheral zone 560 via which zone said contact is connected to the base 550 in a readily conducting manner. An insulation layer of silicon oxide 557 is provided between the contacts 570 and 571. This oxide layer 557 covers the places where the junction between the low-ohmic p-type zone 560 and the high-ohmic p-type material of the region 550 and the p-n junction between the low-ohmic n-type zone 562 and the high-ohmic p-type material of the region 550 emerge at the surface. The collector contact 572 is provided on the highly doped n-type zone 563. Via said highly doped zone 563, a possibly adjacent polycrystalline highly doped n-type region, and the highly doped buried layer 533, the collector contact 572 is connected in a readily conducting manner to the highly doped n-type buried layer 518 which serves to reduce the collector-series resistance. The inset insulation layer 542 furthermore ensures a good insulation between the highly doped p-type zones 563 and 533 on the one hand and the base 550 and the emitter 562 on the other.

The n-p-n transistor is insulated from the n-type body 500 by means of the high-ohmic p-type zone 511 via an n-p and a p-n junction. If desirable the zone 511 may be given a bias voltage in the reverse direction via a connection channel 513 of polycrystalline silicon by means of which the zone 511 may be connected to circuit elements in other islands or, for example, via an upwards conducting path and a contact present at the surface to an external voltage source. On one side the island with the n-p-n transistor is bounded by an isolation zone as a result of which only the connection 513 to the zone 511 can be passed through but which otherwise consists entirely of insulating material namely in that it consists of the inset insulation layer 541, the buried insulation layer 529 inset in the layer 525, a buried insulation layer inset in the silicon layer 510 through which the polycrystalline conductor 513 is conducted, and the thin buried insulation layer 504. Actually, the n-p-n transistor is insulated sufficiently laterally by the insulation layers 541 and 529 since the insulation layer 529 already adjoins the insulating p-type zone 511 present below the n-p-n transistor.

The n-type collector 526 of the n-p-n transistor is now conductively connected to the p-type collector 512 of the p-n-p transistor via an entirely buried connection.

This extends via the buried readily conducting n-type layer 518, the buried polycrystalline n-type zone 514, the buried metal conductor 505, the buried polycrystalline p-type zone 515 and the readily conducting buried p-type layer 501. Otherwise the islands with the n-p-n transistor and the p-n-p transistor, respectively, are isolated from each other namely via a composite isolation zone in which the strips 554 and 528 of polycrystalline silicon surrounded by insulation material are embedded which may be used either in a low-doped form as resistors, or in a highly doped form as inset or buried connection conductors. The relevant isolation zone is composed as follows: the insulation layers 543 inset in the layer 540 and adjoining the island with the n-p-n transistor, and 544 which adjoins the island with the p-n-p transistor, the silicon nitride layer 536, the insulation layers 530 inset in the silicon layer 525 and adjoining the island with the n-p-n transistor, and 531 which adjoins the island with the p-n-p transistor, the silicon nitride layer 519, the buried insulation layer 517 inset in the silicon layer 510, the nitride layer 506 and the nitride layer 503 between which latter insulation layers the buried metal layer 505 is passed. The strip-shaped buried zone 528 of polycrystalline silicon serving, for example, as a resistor is laterally insulated from the above-mentioned islands by the buried insulation layers 530 and 531 inset in the silicon layer 525 and is bounded on its upper side and lower side by the buried silicon nitride layers 536 and 519, respectively. The strip-shaped inset zone 554 of polycrystalline silicon serving as a connection conductor is separated laterally from the above-mentioned islands by the insulation layers 543 and 544, while said zone 554 is also separated entirely by insulating material from the buried resistor 528.

Metal conductors to connect the various contacts may be passed over the buried insulation layers as a result of which only a small capacitive coupling to the nearest zones of semiconductor material exists. The buried metal conductor 505 is bounded by insulation material partly on its upper side and entirely on its lower side. The insulation layers 503 and 506 may also consist of a different material, for example, aluminium oxide.

The preceding description of the Figures is of course not restrictive of the invention. The embodiments described may be varied in various manners without departing from the scope of this invention. They also serve to illustrate that with the principle of the invention may new possibilities are given. They furthermore illustrate that the new method described is particularly suitable for adaptation in the existing planar methods for semiconductor devices, in particular for integrated circuits.

In this embodiment it is also possible to apply the buried metal conductor 505 against the lower side of the silicon nitride layer 519. The buried p-type zone 501 may also be further extended, for example to the layer 525, by further diffusion of boron. Such a buried p-type layer may also be formed from a provided, boron-doped zone at the surface of the body 500 by an upwards boron diffusion in the region 511 to the buried n-type layer 518. This buried p-type layer insulates the n-p-n transistor situated above from the substrate. The buried insulation layers 503, 503 and 504 may be used as a diffusion mask for said buried p-type layer and the buried p-type layer 501.

In this embodiment it is also possible to apply the buried metal conductor 505 against the lower side of the silicon nitride layer 519. The buried p-type zone 501 may also be further extended, for example to the layer 525, by further diffusion of boron. Such a buried p-type layer may also be formed from a provided, boron-doped zone at the surface of the body 500 by an upwards boron diffusion in the region 511 to the buried n-type layer 518. This buried p-type layer insulates the n-p-n transistor situated above from the substrate. The buries insulation layers 502, 503 and 504 may be used as a diffusion mask for said buried p-type layer and the buried p-type layer 501.

Reference is made to Canadian Pat. No. 826,343; U.S. Pat. No. 3,544,858; and Philips Research Reports 25, 118–132, April 1970 for further details on various methods for locally sinking an insulating oxide, and to co-pending U.S. application Ser. No. 32,579, filed Apr. 28, 1970 which contains claims directed to the use of a sunken oxide for island isolation in an integrated circuit.

What is claimed is:

1. A semiconductor device comprising a body, said body comprising a monocrystalline substrate, at least a first layer consisting of silicon semiconducor material on a surface of said substrate, at least part of said first layer being monocrystalline, a second layer of insulating material located at only part of the said substrate surface and buried within the body, the buried second layer consisting at least partly of silicon nitride, and means forming an isolation zone for isolating part of the first semiconductor layer which is monocrystalline from another part of the semiconductor layer, said isolation zone comprising at least partly a third layer of insulating material inset in the first semiconductor layer from its surface and extending down to and at least partly adjoining the second insulating layer, said third layer consisting of silicon oxide formed by in situ conversion of the semiconductor material of the first semiconductor layer, the lateral extent of the second layer being different from the lateral extent of the third layer where it adjoins the second layer.

2. A semiconductor device comprising a body, said body comprising a monocrystalline substrate, at least a first layer consisting of silicon semiconductor material on a surface of said substrate, at least part of said first layer being monocrystalline, a second layer of insulating material located at only part of the said substrate surface and buried within the body, the first layer being monocrystalline where located above the substrate and polycrystalline where located over the buried second layer, and means forming an isolation zone for isolating part of the first semiconductor layer which is monocrystalline from another part of the semiconductor layer, said isolation zone comprising at least partly a third layer of insulating material inset in the first semiconductor layer from its surface and extending down to and at least partly adjoining the second insulating layer, said third layer consisting of silicon oxide formed by in situ conversion of the semiconductor material of the first semiconductor layer, the lateral extent of the second layer being different from the lateral extent of the third layer where it adjoins the second layer.

3. A semiconductor device comprising a body, said body comprising a monocrystalline substrate, at least a first layer consisting of silicon semiconductor material on a surface of said substrate, at least part of said first layer being monocrystalline, a second layer of insulating material located at only part of the said substrate surface and buried within the body, and means forming an isolation zone for isolating part of the first semiconductor layer which is monocrystalline from another part of the semiconductor layer, said isolation zone comprising at least partly a third layer of insulating material inset in the first semiconductor layer from its surface and extending down to and at least partly adjoining the second insulating layer, said third layer consisting of silicon oxide formed by in situ conversion of the semiconductor material of the first semiconductor layer, the lateral extent of the second layer being different from the lateral extent of the third layer where it adjoins the second layer, and at least a part of the isolation zone comprising two inset insulating layers present one above the other and separated from each other by an insulating layer of silicon nitride.

4. A semiconductor device comprising a body, said body comprising a monocrystalline substrate, at least a first layer consisting of silicon semiconductor material on a surface of said substrate, at least part of said first layer being monocrystalline, a second layer of insulating material located at only part of the said substrate surface and buried within the body, a doped channel-interrupting zone present below the buried second layer, and means forming an isolation zone for isolating part of the first semiconductor layer which is monocrystalline from another part of the semiconductor layer, said isolation zone comprising at least partly a third layer of insulating material inset in the first semiconductor layer from its surface and extending down to and at least partly adjoining the second insulating layer, said third layer consisting of silicon oxide formed by in situ conversion of the semiconductor material of the first semiconductor layer, the lateral extent of the second layer being different from the lateral extent of the third layer where it adjoins the second layer.

5. A semiconductor device comprising a body, said body comprising a monocrystalline substrate, at least a first layer of semiconductor material on a surface of said substrate, a second layer of insulating material located at only part of the said substrate surface and buried within the body, and means forming an isolation zone for isolating part of the first semiconductor layer from another part of the semiconductor layer, said isolation zone comprising at least partly a third layer of insulating material inset in the first semiconductor layer from its surface and extending down to and at least partly adjoining the second insulating layer, said third layer being constituted of insulating material formed by in situ conversion of the semiconductor material of the first semiconductor layer, the second insulating layer comprising throughout an impurity which has a preference for absorption in the material of the inset third layer.

6. A semiconductor device as claimed in claim 5 wherein the semiconductor layer consists of silicon, the inset third layer consists of silicon oxide, and the buried second layer comprises boron.

7. A semiconductor device as claimed in claim 2, wherein the second layer is inset in the substrate to a depth of more than $0.5\mu$.

8. A semiconductor device as claimed in claim 2, wherein in the substrate beside the buried second layer is a highly doped semiconductor zone, and a semiconductor circuit element is built into the part of the first layer over the said semiconductor zone.

9. A semiconductor device as claimed in claim 2, wherein the inset third layer entirely overlaps the buried second layer at least locally.

10. A semiconductor device as claimed in claim 2, wherein the polycrystalline part of the first layer is doped with an impurity throughout its thickness and has a low resistivity.

11. A semiconductor device as claimed in claim 10, wherein the polycrystalline part adjoins laterally a monocrystalline part of the semiconductor layer and constitutes a vertical conductor for a deep zone in the adjoining monocrystalline part.

12. A semiconductor device as claimed in claim 2, wherein the inset isolation layer comprises strip-shaped parts which do not adjoin the buried second layer on their lower side and which are separated laterally from a part which does adjoin the buried second layer.

13. A semiconductor device as claimed in claim 12, wherein the said strip-shaped parts of the isolation zone which do not adjoin the buried second layer divides the region of the first layer in which it is inset into two parts, one region part comprising a p-n junction between two zones of opposite conductivity types present one above the other of which the lowermost zone is connected to the surface of the body along a path underneath the inset insulation layer and via an ohmic connection in the other region part of semiconductor material and is conductively connected to a contact at the surface.

14. A semiconductor device as claimed in claim 13, wherein the p-n junction is substantially flat and is bounded on all sides by the inset third layer.

15. A semiconductor device as claimed in claim 13, wherein the lowermost zone is the collector zone of a transistor and the p-n junction is the base-collector junction, or the lowermost zone is the base zone of a transistor and the p-n junction is the emitter-base junction.

16. A semiconductor device as claimed in claim 2 wherein the body comprises at least one transistor in which the collector zone is at the surface and the emitter zone is buried in the body, the isolation zone comprises insulating material which laterally bounds the base zone, and the buried emitter zone is connected to a contact provided on the semiconductor surface along a path underneath said isolation zone and via an upwardly conducting path through the semiconductor on the other side of the isolation zone.

17. A semiconductor device as claimed in claim 16, wherein at least two transistors are present with a common buried emitter zone, and in which the transistor base and collector zones are separated by isolation zones of insulating material.

18. A semiconductor device as claimed in claim 16, wherein the emitter-base junction is substantially flat and is bounded along its circumference by insulating material.

19. A semiconductor device as claimed in claim 16, wherein the collector zone is separated laterally at least over a part of its thickness from an upwardly conducted base contacting zone by an isolation zone which comprises at least one inset insulation layer.

20. A semiconductor device as claimed in claim 2 and further comprising an interconnecting zone of an electrically conducting material and having an intermediate section buried in an isolation zone and bounded on all sides by insulating material.

21. A semiconductor device as claimed in claim 20 wherein the buried zone of electrically conducting material has the form of a strip which extends in the longitudinal direction of the isolation zone.

22. A semiconductor device as claimed in claim 21 wherein the body comprises plural circuit elements interconnected by the buried zone.

23. A semiconductor device as claimed in claim 21 wherein the buried zone consists of a high-ohmic material constructed as a resistor.

24. A semiconductor device as claimed in claim 20, wherein the buried zone of an electrically conducting material extends transversely through the isolation zone and connects two semiconductor zones present on either side of the isolation zone.

25. A semiconductor device as claimed in claim 20 wherein the buried conductive zone consists at least partly of metal.

26. A semiconductor device as claimed in claim 25 wherein the buried conductive zone forms an ohmic connection between two semiconductor zones of opposite conductivity types.

27. A semiconductor device as claimed in claim 26 wherein the buried conductive zone interconnects the collectors of an n-p-n and a p-n-p transistor.

28. A semiconductor device as claimed in claim 20 wherein the conductive zone buried in the isolation zone consists of polycrystalline semiconductor material.

29. A semiconductor device as claimed in claim 1, wherein active zones of a semiconductor circuit element are provided in the monocrystalline part of the first layer.

30. A semiconductor device as claimed in claim 2, wherein active zones of a semiconductor circuit element are provided in the monocrystalline part of the first layer.

31. A semiconductor device as claimed in claim 3, wherein active zones of a semiconductor circuit element are provided in the monocrystalline part of the first layer.

32. A semiconductor device as claimed in claim 4, wherein active zones of a semiconductor circuit element are provided in the monocrystalline part of the first layer.

* * * * *